United States Patent
Dunworth et al.

(10) Patent No.: US 10,965,261 B2
(45) Date of Patent: Mar. 30, 2021

(54) POWER AMPLIFIER CIRCUIT

(71) Applicant: Qualcomm Incorporated, San Diego, CA (US)

(72) Inventors: Jeremy Dunworth, La Jolla, CA (US); Hyunchul Park, San Diego, CA (US); Bon-Hyun Ku, San Diego, CA (US); Vladimir Aparin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/208,398

(22) Filed: Dec. 3, 2018

(65) Prior Publication Data

US 2019/0173439 A1 Jun. 6, 2019

Related U.S. Application Data

(60) Provisional application No. 62/595,029, filed on Dec. 5, 2017.

(51) Int. Cl.
  *H03F 3/21* (2006.01)
  *H03F 3/195* (2006.01)
  (Continued)

(52) U.S. Cl.
  CPC .......... *H03F 3/211* (2013.01); *H03F 1/0261* (2013.01); *H03F 1/565* (2013.01); *H03F 3/193* (2013.01);
  (Continued)

(58) Field of Classification Search
  CPC ...................................................... H03F 3/211
  See application file for complete search history.

(56) References Cited

U.S. PATENT DOCUMENTS 4,774,477 A * 9/1988 Rodes .................. H03F 1/3223
  330/195
9,154,356 B2 * 10/2015 Tasic .................. H04L 27/2647
  (Continued)

FOREIGN PATENT DOCUMENTS

CN 107332522 A 11/2017

OTHER PUBLICATIONS

Aoki I., et al., "Distributed Active Transformer-A New Power-Combining and Impedance-Transformation Technique", IEEE Transactions on Microwave Theory and Techniques, vol. 50, No. 1, Jan. 2002, XP055577765, New York, pp. 316-331, Retrieved from the Internet: URL:https://ieeexplore.ieee.org/ielx5/22/21133/00981284.pdf? tp=&arnumber=981284&isnumber=21133.
(Continued)

*Primary Examiner* — Patricia T Nguyen
(74) *Attorney, Agent, or Firm* — QUALCOMM Incorporated

(57) ABSTRACT

The present disclosure provides an amplifier circuit that includes one or more amplifier stages, each of the one or more amplifier stages including a complementary transistor configuration. The complementary transistor configuration includes an NMOS transistor and a PMOS transistor. The NMOS transistor is electrically coupled in parallel to the PMOS transistor. The amplifier circuit further includes an output amplifier stage electrically coupled to an output of the one or more amplifier stages, the output amplifier stage including a non-complementary transistor configuration including one or more NMOS transistors or PMOS transistors.

28 Claims, 15 Drawing Sheets

(51) Int. Cl.

| | |
|---|---|
| *H03F 3/213* | (2006.01) |
| *H03F 1/56* | (2006.01) |
| *H03F 3/45* | (2006.01) |
| *H03F 1/02* | (2006.01) |
| *H03F 3/30* | (2006.01) |
| *H03F 3/345* | (2006.01) |
| *H03F 3/193* | (2006.01) |
| *H03F 3/24* | (2006.01) |

(52) U.S. Cl.
CPC ............ *H03F 3/195* (2013.01); *H03F 3/213* (2013.01); *H03F 3/245* (2013.01); *H03F 3/301* (2013.01); *H03F 3/345* (2013.01); *H03F 3/45179* (2013.01); *H03F 3/45475* (2013.01); *H03F 2200/267* (2013.01); *H03F 2200/294* (2013.01); *H03F 2200/318* (2013.01); *H03F 2200/336* (2013.01); *H03F 2200/405* (2013.01); *H03F 2200/411* (2013.01); *H03F 2200/451* (2013.01); *H03F 2200/48* (2013.01); *H03F 2200/534* (2013.01); *H03F 2200/537* (2013.01); *H03F 2200/541* (2013.01); *H03F 2203/30081* (2013.01); *H03F 2203/30114* (2013.01); *H03F 2203/30144* (2013.01); *H03F 2203/45228* (2013.01); *H03F 2203/45731* (2013.01)

(56) References Cited

U.S. PATENT DOCUMENTS

| | | | |
|---|---|---|---|
| 9,673,782 | B1 | 6/2017 | Andrabi et al. |
| 9,767,888 | B1 | 9/2017 | Ravi et al. |
| 9,800,273 | B1 | 10/2017 | Abdelhalem et al. |
| 2008/0116973 | A1* | 5/2008 | McMorrow .............. H04B 1/48 330/251 |
| 2008/0290948 | A1* | 11/2008 | Fujii ...................... H03F 3/602 330/295 |
| 2011/0204980 | A1* | 8/2011 | Blednov ................ H03F 3/195 330/295 |
| 2011/0304395 | A1 | 12/2011 | Koo et al. |
| 2012/0032743 | A1* | 2/2012 | Hsieh ..................... H03F 1/223 330/285 |
| 2013/0281040 | A1 | 10/2013 | Paul et al. |
| 2015/0054581 | A1 | 2/2015 | Omid-Zohoor |
| 2015/0249433 | A1* | 9/2015 | Tsutsui ................ H04B 1/0053 455/90.2 |
| 2015/0295542 | A1* | 10/2015 | Moronval ................ H03F 3/19 455/561 |
| 2016/0164476 | A1* | 6/2016 | Wang ..................... H03F 1/223 330/250 |
| 2016/0373063 | A1* | 12/2016 | Khandavalli ......... H03F 1/0227 |
| 2017/0264297 | A1 | 9/2017 | Mo et al. |
| 2018/0088176 | A1 | 3/2018 | Uemura |

OTHER PUBLICATIONS

International Search Report and Written Opinion—PCT/US2018/063913—ISA/EPO—dated Mar. 8, 2019.

Kulkarni S., et al., "14.3 A Push-Pull mm-Wave Power Amplifier with 0.8 AM-PM Distortion in 40nm CMOS", 2014 IEEE International Solid-State Circuits Conference Digest of Technical Papers (ISSCC), San Francisco, CA, 2014, pp. 252-253.

\* cited by examiner

US 10,965,261 B2

POWER AMPLIFIER CIRCUIT

CLAIM OF PRIORITY UNDER 35 U.S.C. § 119

The present Application for Patent claims priority to Provisional Application No. 62/595,029 entitled "MODIFIED INVERTING POWER AMPLIFIER" filed Dec. 5, 2017 and assigned to the assignee hereof and hereby expressly incorporated by reference herein in its entirety.

FIELD

The present disclosure relates generally to amplifier circuits, and particularly for amplifier circuits that may have desirable characteristics for use in higher frequency (e.g., mmWave) wireless communication applications.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Wireless communication devices, such as a UE or base station, include one or more power amplifiers. Power amplifier circuit topologies for wireless communication applications that have high linearity, high efficiency, wide bandwidths, with low supply voltages are desirable, particularly in frequencies in the mmWave range.

SUMMARY

In one aspect of the disclosure, an inverting amplifier circuit is provided. The inverting amplifier circuit includes a first inductive impedance element electrically connected to a first supply voltage. The inverting amplifier circuit further includes an N-channel metal oxide semiconductor (NMOS) transistor having an NMOS gate terminal electrically connected to an input node configured to receive an input signal, an NMOS drain terminal electrically connected to the first supply voltage through the first inductive impedance element, and an NMOS source terminal electrically connected to a first ground. The inverting amplifier circuit further includes a second inductive impedance element electrically connected to a second ground. The inverting amplifier circuit further includes a P-channel metal oxide semiconductor (PMOS) transistor having a PMOS gate terminal electrically connected to the input node configured to receive the input signal, a PMOS drain terminal electrically connected to the second ground through the second inductive impedance element, and a PMOS source terminal electrically connected to a second supply voltage. The inverting amplifier circuit further includes one or more reactive elements electrically connected to an output node configured to provide an output signal. The NMOS drain terminal and the PMOS drain terminal are electrically connected through the one or more reactive elements to the output node.

In another aspect of the disclosure, an inverting amplifier circuit is provided. The inverting amplifier circuit includes a single ended NMOS transistor circuit with a gate terminal connected to an input node configured to receive an input signal, a source terminal connected to ground, and a drain terminal connected to a supply voltage through a first inductive impedance element. The inverting amplifier circuit further includes a single ended PMOS transistor circuit with a gate terminal connected to the input node, a source terminal connected to a supply voltage, and a drain terminal connected to ground through a second inductive impedance element, the signal ended NMOS transistor circuit electrically connected in parallel to the single ended PMOS transistor circuit to provide a common output signal through one or more reactive components.

In yet another aspect, an inter-stage matching circuit between amplifier circuit stages, is provided. The inter-stage matching circuit includes a first inductive element electrically connected to an input node configured to receive a first portion of a differential input signal. The inter-stage matching circuit further includes a second inductive element electrically connected to an input node configured to receive a second portion of a differential input signal. The inter-stage matching circuit further includes a high-k transformer having a primary side electrically connected in series on one side to the first inductive element and to the second inductive element on the other side. The inter-stage matching circuit further includes a third inductive element electrically connected to one side of a secondary side of the high-k transformer and configured to provide a first output. The inter-stage matching circuit further includes a fourth inductive element electrically connected to the other side of the secondary side the high-k transformer and configured to provide a second output.

In yet another aspect, a method to bias a portion of an amplifier circuit is provided. The method includes determining an operating condition of the amplifier circuit. The method further includes determining a bias signal magnitude for the portion of the amplifier circuit based on the operating condition. The method further includes providing the determined bias signal to the portion of the amplifier circuit.

In yet another aspect, an amplifier circuit is provided. The amplifier circuit includes one or more amplifier stages, each of the one or more amplifier stages including a complementary transistor configuration. The complementary transistor configuration includes an NMOS transistor having a gate terminal electrically coupled to an input node configured to receive an input signal, a source terminal electrically coupled to ground, and a drain terminal electrically coupled to a first supply voltage through a first inductive impedance element. The complementary transistor configuration further includes a PMOS transistor having a gate terminal electrically coupled to the input node, a source terminal electrically coupled to a second supply voltage, and a drain terminal electrically coupled to ground through a second inductive impedance element, the NMOS transistor electrically coupled in parallel to the PMOS transistor. The amplifier circuit further includes an output amplifier stage electrically coupled to an output of the one or more amplifier stages, the output amplifier stage including a non-complementary transistor configuration including one or more NMOS transistors or PMOS transistors.

In yet another aspect, an amplifier circuit is provided. The amplifier circuit includes a first amplifier stage including a first path electrically coupled to one or more input nodes and a second path electrically coupled to the one or more input nodes. The first amplifier stage includes one or more first PMOS transistors in the first path and one or more first NMOS transistors in the second path. The amplifier circuit further includes a second amplifier stage including a first path electrically coupled to the first path of the first amplifier stage and including one or more second NMOS transistors in the first path. The second amplifier stage includes a second path electrically coupled to the second path of the first amplifier stage and including one or more second PMOS transistors in the second path. The amplifier circuit further includes an output amplifier stage electrically coupled to the second amplifier stage and further electrically coupled to both the first path and the second path to form a common path for the output amplifier stage. The output amplifier stage includes a non-complementary transistor configuration.

In yet another aspect, a method for amplifying a signal in an amplifier circuit is provided. The method includes amplifying the signal using a first amplifier stage having a first path electrically coupled to one or more input nodes and a second path electrically coupled to the one or more input nodes where the first amplifier stage includes one or more first PMOS transistors in the first path and one or more first NMOS transistors in the second path. The method further includes amplifying the signal using a second amplifier stage having a first path electrically coupled to the first path of the first amplifier stage and including one or more second NMOS transistors in the first path. The second amplifier stage has a second path electrically coupled to the second path of the first amplifier stage and includes one or more second PMOS transistors in the second path. The method further includes amplifying the signal using an output amplifier stage electrically coupled to the second amplifier stage and further electrically coupled to both the first path and the second path of the second amplifier stage to form a common path for the output amplifier stage. The output amplifier stage includes a non-complementary transistor configuration.

In yet another aspect, an amplifier circuit for amplifying a signal is provided. The amplifier circuit includes means for amplifying the signal using a first amplifier stage having a first path electrically coupled to one or more input nodes and a second path electrically coupled to the one or more input nodes where the first amplifier stage includes one or more first PMOS transistors in the first path and one or more first NMOS transistors in the second path. The amplifier circuit further includes means for amplifying the signal using a second amplifier stage having a first path electrically coupled to the first path of the first amplifier stage and including one or more second NMOS transistors in the first path. The second amplifier stage has a second path electrically coupled to the second path of the first amplifier stage and includes one or more second PMOS transistors in the second path. The amplifier circuit further includes means for amplifying the signal using an output amplifier stage electrically coupled to the second amplifier stage and further electrically coupled to both the first path and the second path of the second amplifier stage to form a common path for the output amplifier stage. The output amplifier stage includes a non-complementary transistor configuration.

DETAILED DESCRIPTION

Figure 1:
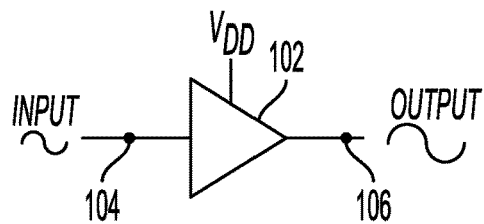
FIG. 1 is a functional block diagram of an amplifier circuit.

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Mobile radio frequency (RF) designs (e.g., mobile RF transceivers) have migrated to deep sub-micron process nodes due to cost and power consumption considerations. The design complexity of mobile RF transceivers is further complicated by added circuit function to support communication enhancements. Some of these enhancements involve using mmWave operating frequency ranges (e.g., 20-80 GHz) for higher bandwidth that lead to other design challenges for mobile RF transceivers including analog/RF performance considerations. In particular, for these higher frequency applications there may be a need for amplifier circuit topologies that can accommodate wide bandwidths, have high linearity, and have high efficiency. As lower power devices for mmWave applications are also being considered, low supply voltages ($V_{dd}$) are desirable. In mmWave applications, due to beam-forming, power amplifier circuits may be built using nano-meter (nm) scale complementary metal-oxide semiconductor (CMOS) technologies.

Aspects of the present disclosure are related to improved power amplifier circuit topologies, for example that may be used in millimeter wave 5G systems or LTE systems or other higher frequency applications (e.g., higher than 6 GHz and particularly to frequencies greater than 20 GHz). In particular, aspects of the present disclosure are related to an amplifier circuit topology with two complementary circuits of N-channel metal oxide semiconductor (NMOS) and P-channel metal oxide semiconductor (PMOS). In an aspect, the double NMOS/PMOS circuit amplifier circuit topologies described herein combine the inverter functionality with other advantages resulting from using single ended circuits. In another aspect, the complementary circuits of NMOS and PMOS may form a part of a first stage of an amplifier circuit topology that is provided to an output amplifier stage that includes a non-complementary configuration (e.g., has transistors of just one type such as NMOS only). In one aspect, a complementary transistor configuration as described herein may refer to a circuit configuration that includes NMOS and PMOS transistors operating on a signal that is eventually combined for a common output. A non-complementary transistor configuration as described herein may refer to a circuit configuration that includes just one type of transistor between an input and an output (all NMOS or all PMOS).

FIG. 1 is a functional block diagram of an amplifier circuit 102. The amplifier circuit 102 is configured to receive an input signal at an input node 104 and provide an output signal at an output node 106 that is based on the input signal. A supply voltage $V_{DD}$ may be provided to the amplifier circuit 102 and used by the amplifier circuit 102 to produce the output signal at the output node 106 based on the input signal. The amplifier circuit 102 may be used in a wireless communication application, and particularly in a wireless transmit circuit.

Figure 2:
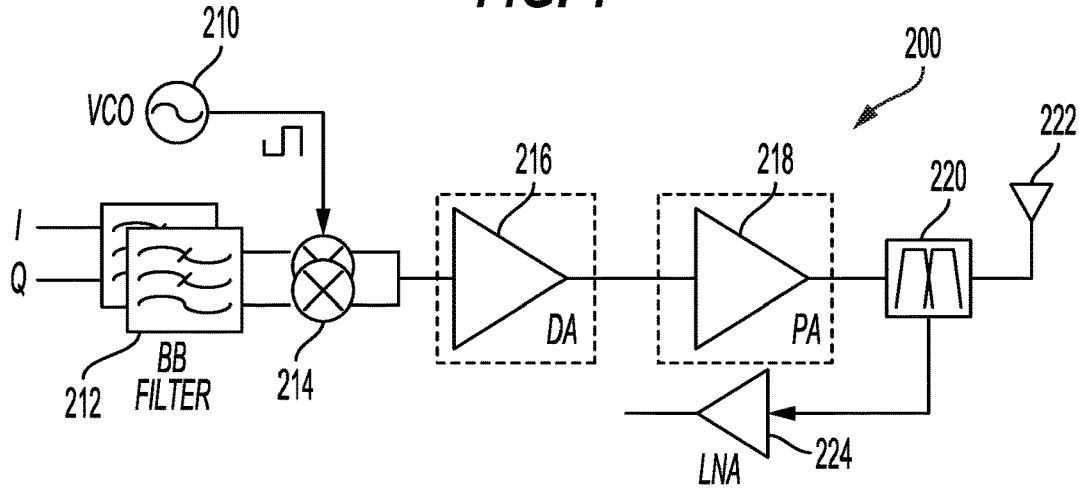
FIG. 2 is a functional block diagram of at least a portion of an example of a simplified wireless transmit circuit that may include the amplifier circuit of FIG. 1.

FIG. 2 is a functional block diagram of at least a portion of an example of a simplified wireless transmit circuit 200 that may include the amplifier circuit 102 of FIG. 1. The transmit circuit 200 is configured to receive signals/information for transmission (shown as I and Q values) which is provided to one or more base band filters 212. The filtered output is provided to one or more mixers 214 controlled by a voltage controlled oscillator (VCO) 210. The output from the one or more mixers is provided to a driver amplifier 216 whose output is provided to a power amplifier 218 to produce an amplified signal for transmission. The driver amplifier 216 and power amplifier 218 together may considered as an amplifier circuit having one or more amplifier stages including an output amplifier stage that may be considered part of the power amplifier 218. The amplified signal is output to the antenna 222 through one or more filters 220 (e.g., duplexers if used as a frequency division duplex transceiver or other filters). The antenna 222 may be used for both wirelessly transmitting and receiving data. As such the transmit circuit 200 shows a receive path through the one or more filters 220 to be provided to a low noise amplifier (LNA) 224 for further processing by a receiver circuit.

The amplifier circuit 102 of FIG. 1 may form a portion of any of the driver amplifier 216 or power amplifier 218 (e.g., form a portion or all of a multi-stage amplifier circuit including one of or both of the driver amplifier 216 and the power amplifier 218).

Figure 3A:
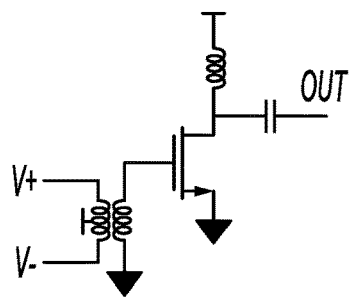
FIGS. 3A, 3B, and 3C are schematic diagrams of three examples of different amplifier circuit topologies.
Figure 3B:
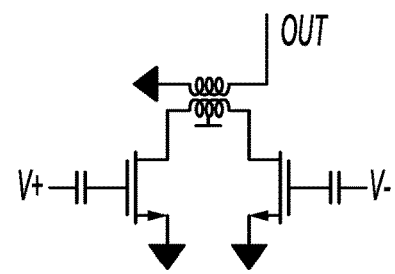
Figure 3C:
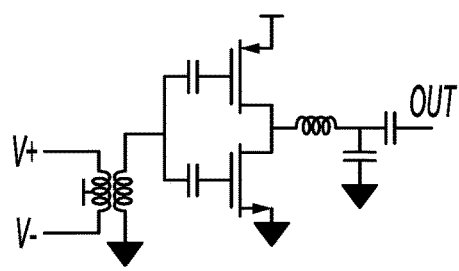

Various techniques have been developed for improving power amplifier circuit designs. For example, linearity can be improved by various species of differential inverter-style power amplifier circuits and other topologies. FIGS. 3A, 3B, and 3C are schematic diagrams of three examples of different amplifier circuit topologies. FIG. 3A illustrates a single-ended type amplifier circuit topology which may have good efficiency and low loss on the matching output (e.g., simple output matching network) but may suffer from poor common mode rejection and other power output issues. FIG. 3B illustrates a differential type amplifier circuit topology that may have higher output power relative to FIG. 3A, good common mode rejection and good rejection of even mode harmonics and may have poor efficiency due to the lossy transformer (e.g., due to low coupling factor and poor transformer quality (Q) factor). FIG. 3C illustrates an inverter type amplifier circuit topology. The NMOS and PMOS transistors in the inverter amplifier circuit are in a stacked configuration (e.g., they are connected in series through their drain to source paths). The inverter type amplifier circuit topology may also have good rejection of even mode harmonics like the differential configuration but has lower output power given the same output load and may have poor efficiency due to poor voltage headroom by a limited supply voltage.

Aspects of the present disclosure relate to an improved power amplifier circuit topology based on a modified inverter amplifier circuit using NMOS and PMOS transistors to enhance performance and address at least a portion of the design challenges of the amplifier topologies described with reference to FIGS. 3A, 3B, and 3C. In particular, aspects of the present disclosure are related to an amplifier circuit topology with two single-ended circuits of NMOS and PMOS connected in parallel.

Figure 4A:
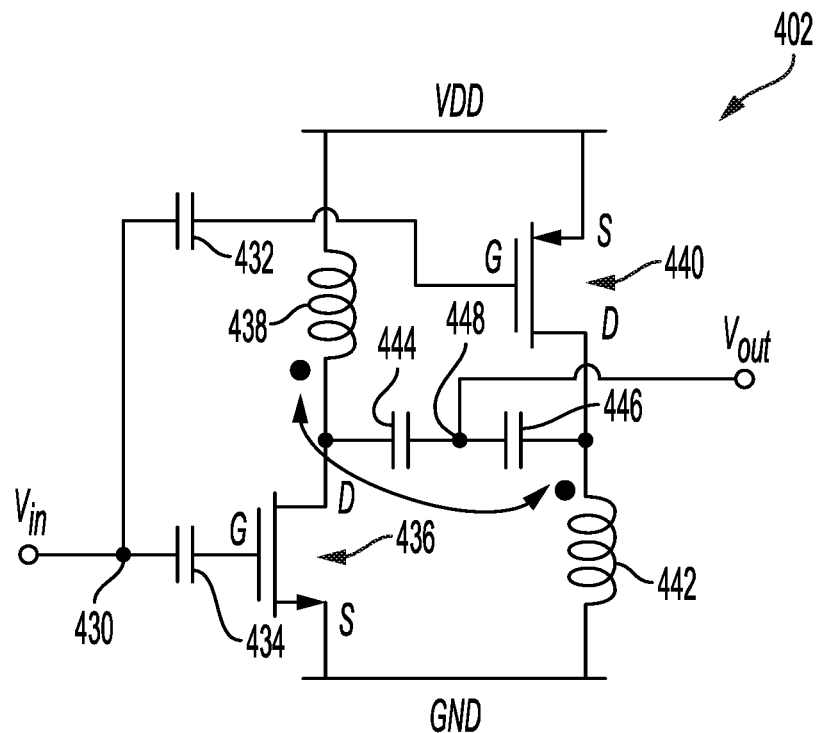
FIGS. 4A and 4B are schematic diagrams of an example of an amplifier circuit topology in accordance with certain aspects of the present disclosure.
Figure 4B:
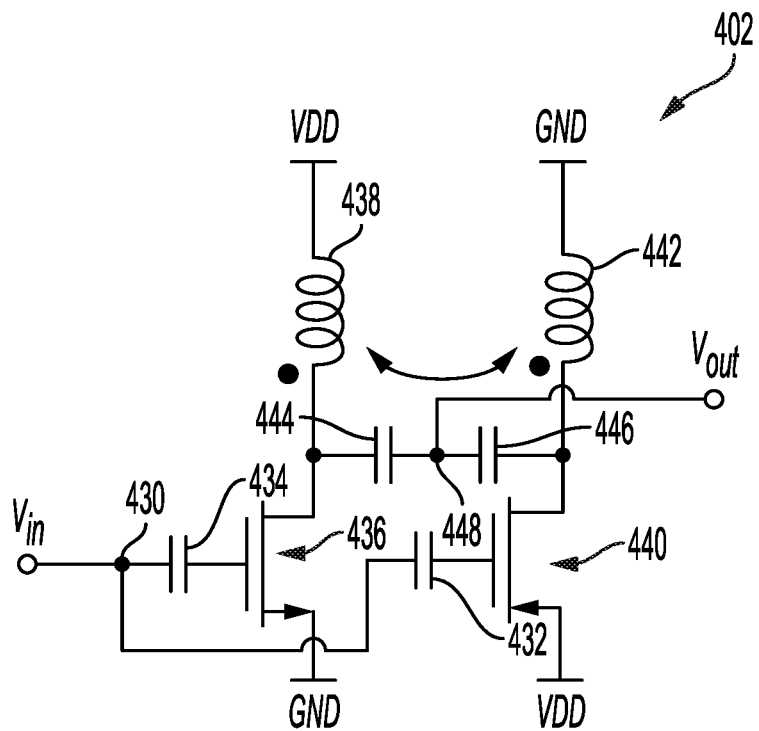

FIGS. 4A and 4B are schematic diagrams of an example of an amplifier circuit topology in accordance with certain aspects of the present disclosure. FIGS. 4A and 4B are equivalent circuit configurations and are provided to show that different connections to the supply voltage $V_{DD}$ and ground (e.g., common between multiple elements or separate) may be possible. The amplifier circuit 402 of either FIG. 4A or 4B includes a first inductive impedance element 438 (e.g., an inductor) electrically coupled to a first supply voltage $V_{DD}$. The amplifier circuit 402 further includes an NMOS transistor 436. The NMOS gate terminal is electrically coupled to an input node 430 configured to receive an input signal (e.g., the signal to be amplified). In certain implementations, the NMOS gate terminal is electrically coupled to the input node 430 through a capacitor 434 (e.g., a first DC blocking capacitor). The NMOS drain terminal is electrically coupled to the first supply voltage $V_{DD}$ through the first inductive impedance element 438. The NMOS source terminal is electrically coupled to a first ground (e.g., GND in FIG. 4A).

The amplifier circuit 402 further includes a second inductive impedance element 442 electrically coupled to a second ground (e.g., GND in FIG. 4A). The amplifier circuit 402 further includes a PMOS transistor 440. The PMOS gate terminal is electrically coupled to the input node 430 configured to receive the input signal. Furthermore, in certain implementations, the PMOS gate terminal is electrically coupled to the input node 430 through a capacitor 432 (e.g., a second DC blocking capacitor). The PMOS drain terminal is electrically coupled to the second ground through the second inductive impedance element 442. The PMOS source terminal is electrically coupled to a second supply voltage (e.g., $V_{DD}$ in FIG. 4A). The first inductive impedance element 438 may be an inductor or may be a portion of a transformer. Likewise, the second inductive impedance element 442 may be an inductor or may be a portion of a transformer. The amplifier circuit 402 therefore includes a complementary transistor configuration with the NMOS transistor 436 and the PMOS transistor 440 (with the PMOS transistor 440 and the NMOS transistor 436 electrically coupled in parallel).

It should be appreciated that any of the supply voltages (e.g., first, second, third supply voltages, etc.) mentioned herein may be either separate supply voltages or a shared/common supply voltage in any combination. It should be appreciated that any of the electrical grounds mentioned herein may be either separate ground connections/nodes or a shared/common ground node in any combination (ground may refer also to a relative ground, floating ground or some desired electric potential difference).

The amplifier circuit 402 further includes one or more reactive elements electrically coupled to an output node 448 configured to provide an output signal. The NMOS drain terminal of the NMOS transistor 436 and the PMOS drain terminal of the PMOS transistor 440 are electrically coupled through the one or more reactive elements to the output node. In certain implementations, as shown in FIGS. 4A and 4B, the one or more reactive elements may include a first reactive element 444 (shown as a capacitor) electrically coupled between the NMOS drain terminal and the output node 448 and a second reactive element 446 (shown as a capacitor) electrically coupled between the PMOS drain terminal and the output node. The one or more reactive elements may be either inductive or capacitive elements (e.g., inductors, capacitors, other reactive network of a combination of inductors or capacitors, transformers, transmission lines, baluns, and the like) depending the application. In FIGS. 4A and 4B, the one or more reactive elements are shown as a capacitor 444 and a capacitor 446 for purposes of illustration only.

FIG. 4A illustrates two open-drain/single ended circuits with one NMOS single ended circuit and another PMOS single ended circuit electrically coupled in parallel. These may work together as an inverter at the output. The topology of the amplifier circuit 402 may allow for overcoming certain of the design challenges of the amplifier circuit topologies shown above with respect to FIGS. 3A, 3B, and 3C. For example, the amplifier circuit 402 may have a higher output power than the inverter amplifier circuit topology shown in FIG. 3C. Furthermore, the amplifier circuit 402 may be more efficient (linear power) than the inverter or differential amplifier circuit topologies shown in FIGS. 3B and 3C while still having good common mode rejection and may have compatible linearity characteristics and harmonic emission profiles.

In certain implementations, the first inductive impedance element 438 and second inductive impedance element 442 are inductively coupled to produce a mutual inductance M such that the inductive impedance elements may be made physically smaller by using mutual inductance (e.g., L+M for combined total inductance for each element).

In certain implementations, the amplifier circuit 402 is configured for mmWave applications in frequency ranges in the higher GHz (e.g., 26-31 GHz although higher frequencies may be possible—e.g., 60+ GHz). As such values of the reactive elements and other elements may be provided to produce the desired output signal based on input signal in those frequency ranges. In addition, the amplifier circuit 402 may allow for sufficient power output levels to allow transmission in ranges desired for various 5G use cases at mmWave frequencies (e.g., on the order of 150 meters or more). In certain implementations, to provide higher output power, aspects of the amplifier circuit 402 may be combined in a differential configuration as will be further described below.

The amplifier circuit 402 may form or be a portion of a stage of a multi-stage amplifier circuit with one or more amplifier stages. As such, outputs from the PMOS drain terminal and the NMOS drain terminal may be provided as inputs to other amplifier stages (and later combined) or may be combined to be provided to a final output amplifier stage.

Figure 4C:
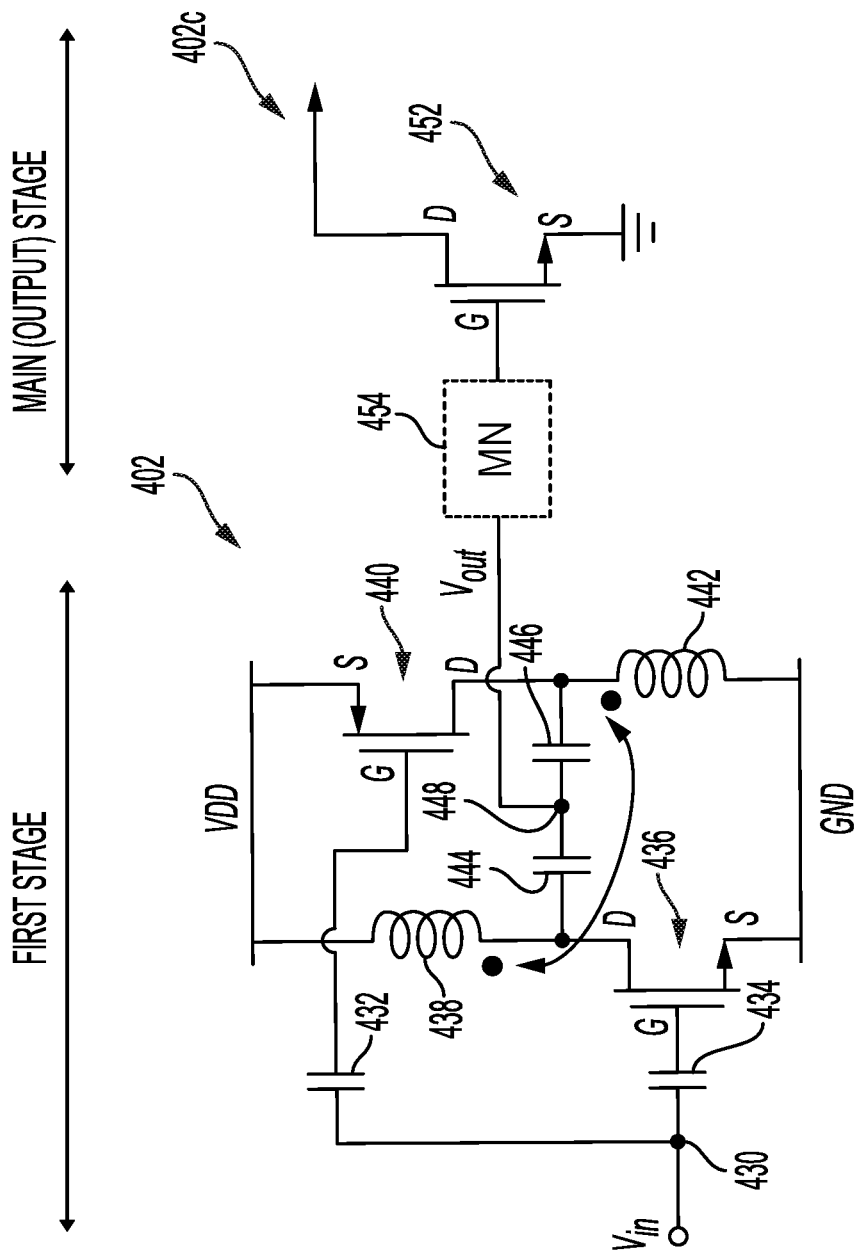
FIGS. 4C and 4D are schematic diagrams of examples of multi-stage amplifier topologies that incorporate the amplifier circuit of FIGS. 4A and 4B.
Figure 4D:
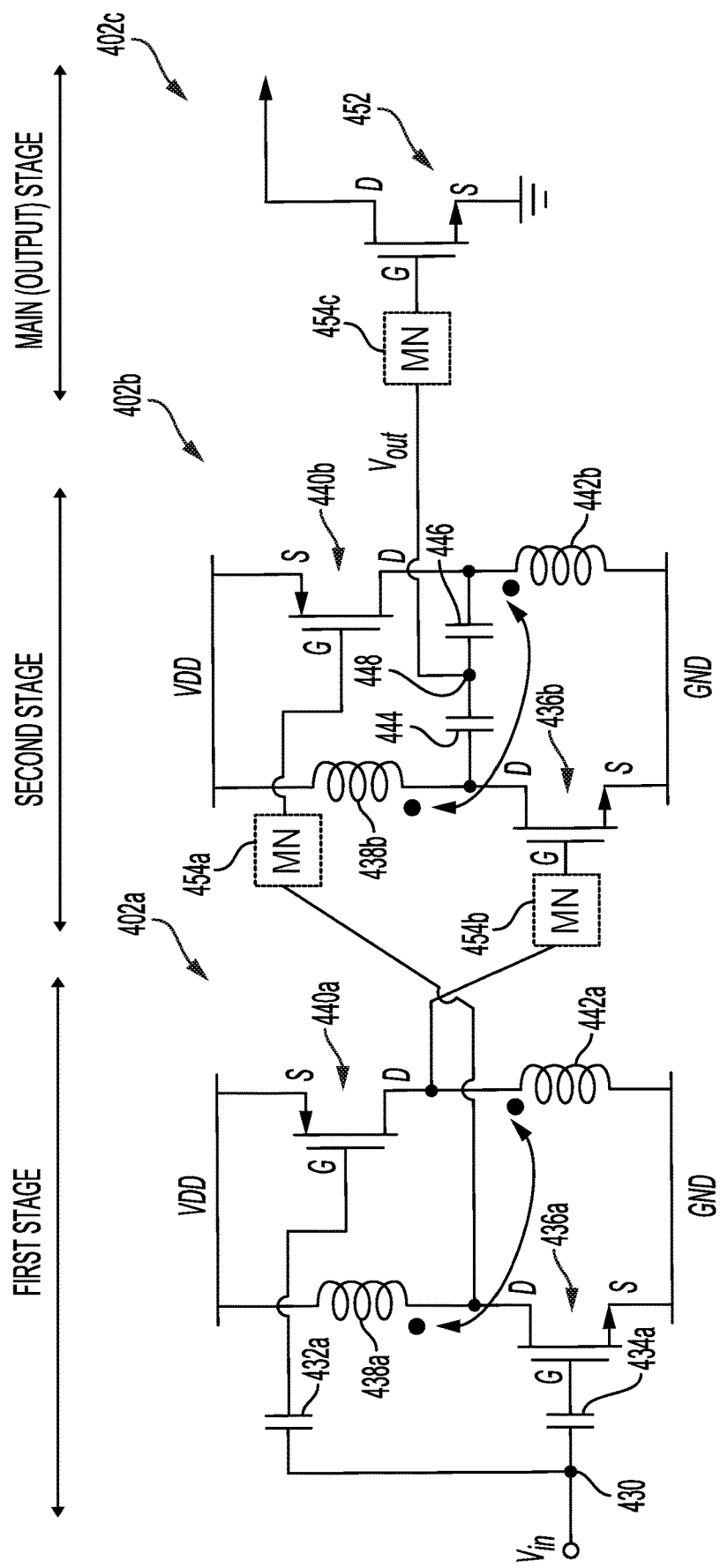

FIGS. 4C and 4D are schematic diagrams of examples of multi-stage amplifier topologies that incorporate the amplifier circuit 402 of FIGS. 4A and 4B. The amplifier topology of FIG. 4C may include a first stage that includes the amplifier circuit 402 of FIGS. 4A and 4B. Particularly, the multi-stage amplifier circuit of FIG. 4C may include one or more amplifier stages (shown as the first stage) where each of the one or more amplifier stages (shown as the first stage) may include a complementary transistor configuration (including both PMOS and NMOS transistors). The complementary transistor configuration includes an NMOS transistor 436 having a gate terminal electrically coupled to an input node configured to receive an input signal. The NMOS transistor 436 further includes a source terminal electrically coupled to ground. The NMOS transistor 436 further includes a drain terminal electrically coupled to a first supply voltage $V_{DD}$ through a first inductive impedance element 438. The complementary transistor configuration includes a PMOS transistor 440 having a gate terminal electrically coupled to the input node. The PMOS transistor 440 further includes a source terminal electrically coupled to a second supply voltage $V_{DD}$. The PMOS transistor 440 further includes a drain terminal electrically coupled to ground through a second inductive impedance element 442. The NMOS transistor 436 is electrically coupled in parallel to the PMOS transistor 440. As described above, the outputs of the NMOS transistor 436 and the PMOS transistor 440 are coupled to provide a common output signal through one or more reactive components (e.g., capacitors as shown).

As shown by the multi-stage amplifier circuit of FIG. 4C, the common output from the first amplifier stage is provided to a main or output amplifier stage including an output amplifier circuit 402c. The common output from the first amplifier stage may be provided to the output amplifier stage through a matching network 454 (e.g., matching circuit that may have one or more reactive elements). The output amplifier stage includes a non-complementary transistor configuration (as compared to the first or other one or more amplifier stage). As such, only one type of CMOS transistor may be used in the output amplifier stage. For example, as shown, the output amplifier circuit 402c includes an output NMOS transistor 452 having a gate terminal coupled to the common output signal from the first stage. The output NMOS transistor 452 has a source terminal electrically coupled to ground and a drain terminal electrically coupled to an amplifier output node (e.g., a connection that leads to an antenna). The output signal from the main stage may be a single ended signal. In some implementations the NMOS transistor 452 may be a PMOS transistor. It should be appreciated that the output amplifier stage could have further elements (e.g., further NMOS transistors) not shown. For example, if the topology is provided in a differential configuration the output amplifier circuit 402c may have two or more NMOS transistor and may be include other circuitry for coupling to an output node (e.g., a balun, transformer or other impedance network, etc.).

It should be appreciated that while labeled as a first stage, in certain implementations of FIG. 4C, other stages may precede the labeled first stage and the input Vin may be replaced by one or more inputs from a previous stage.

The amplifier topology of FIG. 4D includes three stages for purposes of illustration and includes a first amplifier circuit 402a, a second amplifier circuit 402b, and an output amplifier circuit 402c. The first amplifier circuit 402a forming the first amplifier stage includes the amplifier circuit 402 of FIGS. 4A and 4B. However, rather than the output being combined at this first stage, the output from the drain of the NMOS transistor 436a is electrically coupled through a first matching network 454a to the gate terminal of the PMOS transistor 440b of the second amplifier circuit 402b in the second stage. The first matching network 454a may additionally incorporate DC blocking circuitry. Likewise, the output from the drain of the PMOS transistor 440a is electrically coupled through a second matching network 454b to the gate terminal of the NMOS transistor 436b of the second amplifier circuit 402b in the second stage. The second matching network 454b may additionally incorporate DC blocking circuitry. The first and second matching networks 454a and 454b may include reactive elements such as inductors or transformers that may be used to couple signals from the first amplifier circuit 402a in the first stage to the second amplifier circuit 402b in the second stage. In the second stage, the outputs of the NMOS transistor 436b and the PMOS transistor 440b are electrically coupled to a common output node 448 through one or more reactive elements 444 and 446 as described above with reference to FIGS. 4A and 4B. The output signal from the common output node 448 of the second stage is provided to the main or output amplifier stage including a non-complementary configuration as depicted by the third amplifier circuit 402c similar to that described above with reference to FIG. 4C. The output signal may be provided to the output amplifier stage through a third matching network 454c similarly as described with reference to FIG. 4C.

It should be appreciated that while not shown in FIGS. 4A, 4B, 4C, and 4D, bias signals may be applied to various points of the amplifier circuit shown as appropriate (e.g., bias circuitry and connections are not shown in these FIGS. for simplifying the description for illustration of the circuit).

Figure 5:
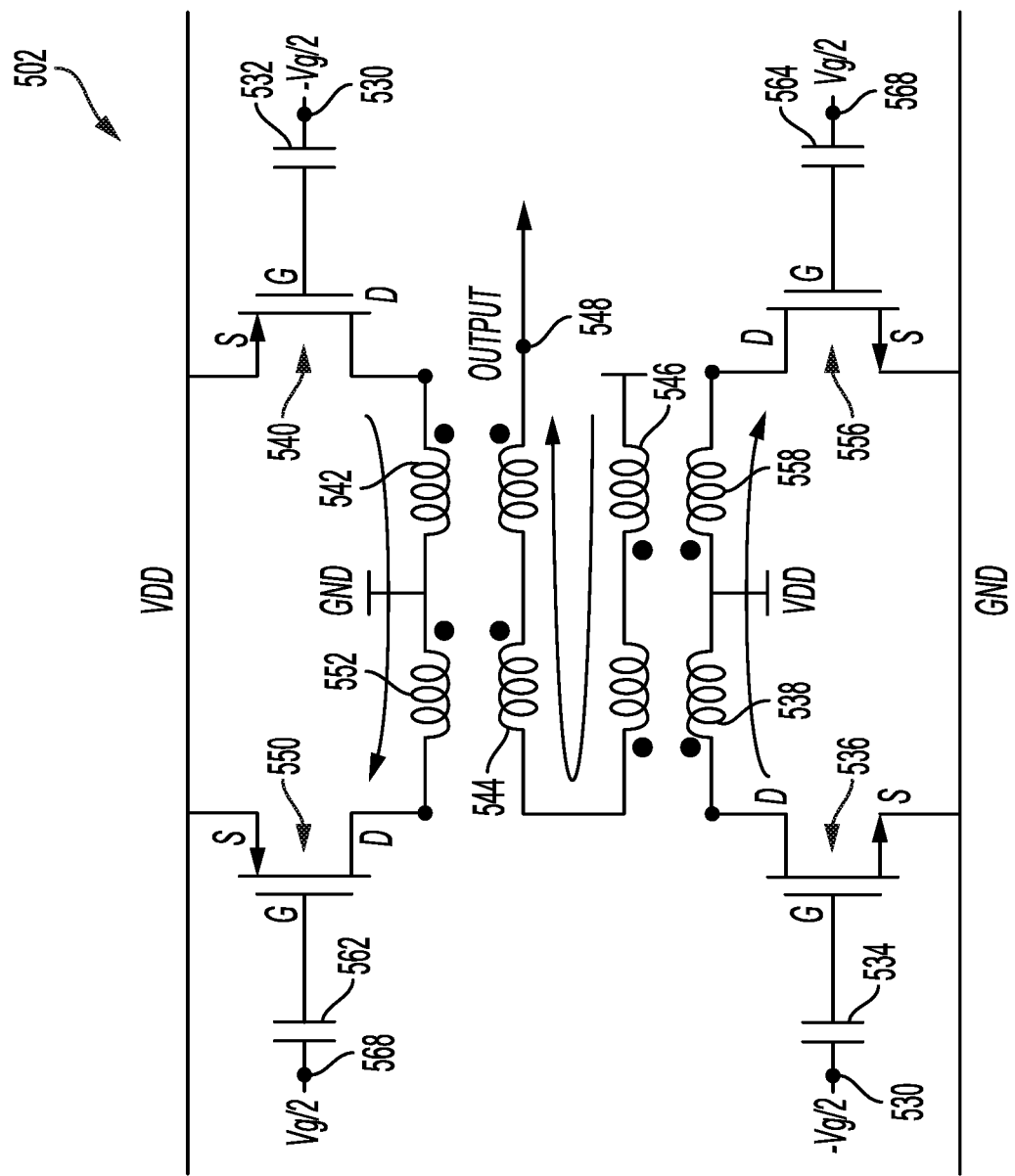
FIG. 5 is a schematic diagram of an example of a differential amplifier circuit topology that incorporates aspects of the amplifier circuit topology of FIGS. 4A and 4B.

FIG. 5 is a schematic diagram of an example of a differential amplifier circuit 502 that incorporates aspects of the amplifier circuit 402 of FIGS. 4A and 4B. The differential amplifier circuit 502 of FIG. 5 includes a first inductive impedance element 538 electrically coupled to a first supply voltage $V_{DD}$. The amplifier circuit 502 further includes a first NMOS transistor 536. The NMOS gate terminal is electrically coupled to a first input node 530 configured to receive a first input signal of a differential signal (e.g., the signal to be amplified). In certain implementations, the NMOS gate terminal is electrically coupled to the first input node 530 through a capacitor 534 (e.g., a first DC blocking capacitor). The NMOS drain terminal is electrically coupled to the first supply voltage $V_{DD}$ through the first inductive impedance element 538. The NMOS source terminal is electrically coupled to ground (e.g., GND in FIG. 5).

The amplifier circuit 502 further includes a second inductive impedance element 542 electrically coupled to ground (e.g., GND in FIG. 5). The amplifier circuit 502 further includes a first PMOS transistor 540. The PMOS gate terminal is electrically coupled to the first input node 530 configured to receive the first input signal of the differential signal. Furthermore, in certain implementations, the PMOS gate terminal is electrically coupled to the input node 530 through a capacitor 532 (e.g., DC blocking capacitor). The PMOS drain terminal is electrically coupled to ground through the second inductive impedance element 542. The PMOS source terminal is electrically coupled to a second supply voltage (e.g., $V_{DD}$ in FIG. 5).

As with FIGS. 4A and 4B, it should be appreciated that any of the supply voltages (e.g., first, second, third supply voltages, etc.) mentioned herein may be either separate supply voltages or a shared/common supply voltage in any combination (e.g., supply voltages can be separated for NMOS and PMOS, instead of stacking voltages as shown). It should be appreciated that any of the electrical grounds mentioned herein may be either separate ground connections or a shared/common ground in any combination (ground may refer also to a relative ground, floating ground, or some desired potential difference).

The differential amplifier circuit 502 further includes a third inductive impedance element 558 electrically coupled to a third supply voltage $V_{DD}$ (e.g., that may be the same as the first supply voltage). The amplifier circuit 502 further includes a second NMOS transistor 556. The second NMOS gate terminal is electrically coupled to a second input node 568 configured to receive a second input signal of the differential signal. In some implementations, the second NMOS gate terminal is electrically coupled to the second input node 568 through a capacitor 564. The second NMOS drain terminal is electrically coupled to the third supply voltage $V_{DD}$ through the third inductive impedance element 558. The second NMOS source terminal is electrically coupled to ground (e.g., could be the same as the first ground).

The differential amplifier circuit 502 further includes a fourth inductive impedance element 552 electrically coupled to a fourth ground. The amplifier circuit 502 further includes a second PMOS transistor 550. The second PMOS gate terminal is electrically coupled to the second input node 568. In certain implementations, the second PMOS gate terminal is electrically coupled to the second input node 568 through a capacitor 562. A second PMOS drain terminal is electrically coupled to ground through the fourth inductive impedance element 552. The second PMOS source terminal is electrically coupled to a fourth supply voltage (may be the same as the second supply voltage).

The drain terminals of the transistors are electrically coupled through the one or more reactive elements 544 and 546 to the output node 548. As shown in FIG. 5, the one or more reactive elements are two separated transformers (or could be one combined transformer) (and the transformers could be series in or parallel) to provide the output signal through the output node 548. As described above the inductive impedance elements (e.g., the first, second, third, and fourth inductive impedance elements 538, 558, 542, and 552) may form portions of the transformer (or one or more transformers) or be configured to have mutual coupling to provide mutual inductance in order to decrease size of the inductors. Use of the differential amplifier circuit 502 may allow performance increases in certain aspects and increased power output. While coupled to a single common output it should be appreciated that the amplifier circuit 502 may be configured as a stage of one or more stages of a multi-stage amplifier circuit and provide a differential output to another stage (e.g., such as an intermediate stage or a differential output to a final output stage). As described above, the amplifier circuit 502 includes a complementary transistor configuration and may be coupled to an output amplifier stage having a non-complementary transistor configuration.

Aspects of FIGS. 4A-D and 5 may have various benefits including increased linear output power extension (e.g., linearity), reduction in required supply voltage magnitudes, lower power consumption, bandwidth expansion, chip area reduction, and other benefits. Furthermore, aspects of FIGS. 4A/4B and 5 may be incorporated into a multi-stage amplifier circuit topology with a driver amplifier portion and power amplifier portion. Certain aspects of FIGS. 4A/4B and 5 may be particularly suitable for driver amplifier circuits (and in particular beneficial for adequate performance in mmWave frequency bands).

Figure 6:
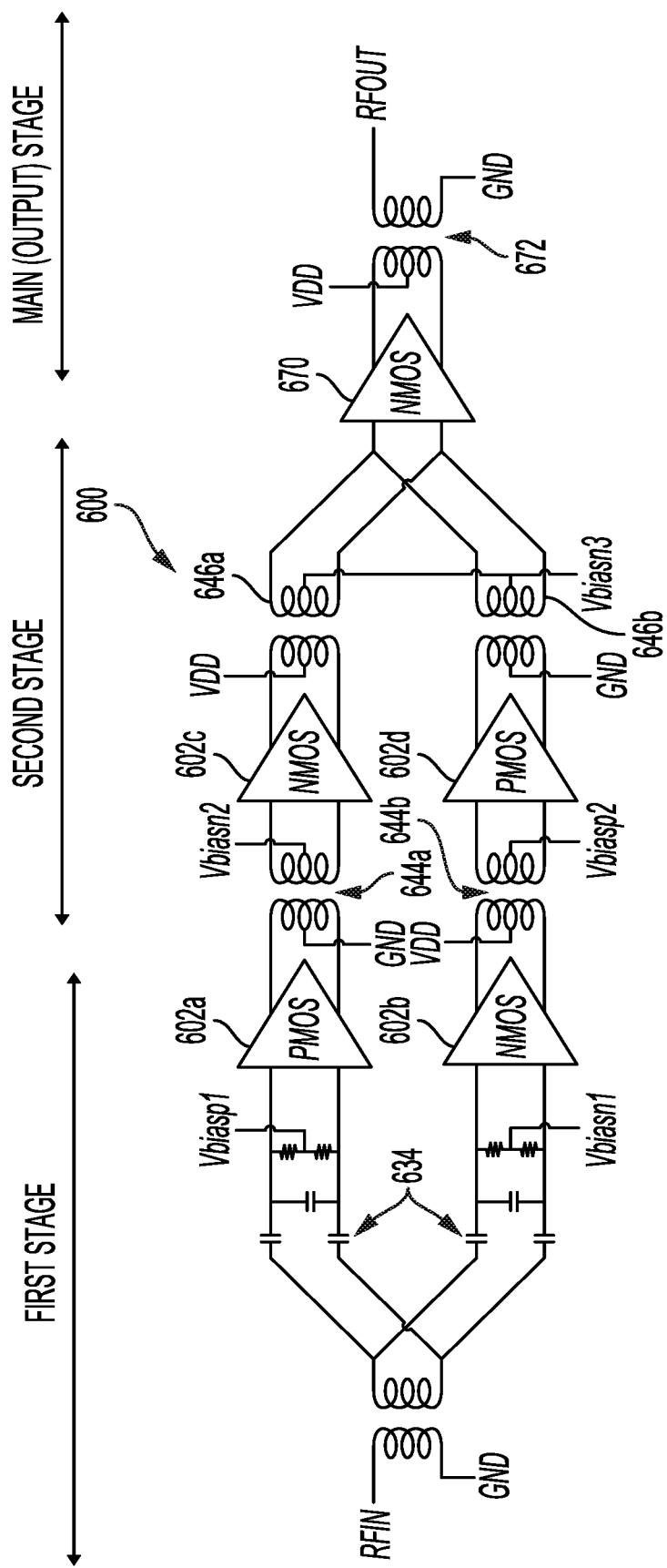
FIG. 6 is a schematic diagram of an example of a multi-stage amplifier circuit topology that incorporates aspects of the amplifier circuit topologies shown in FIGS. 4A, 4B, and 5.

FIG. 6 is a schematic diagram of an example of a multi-stage amplifier circuit topology 600 that incorporates aspects of the amplifier circuit topologies shown in FIGS. 4A, 4B, and 5. The differential amplifier circuit topology 600 includes three stages including a first amplifier stage (e.g., first driver stage) having amplifier circuits 602a and 602b, a second amplifier stage (e.g., second driver stage) having amplifier circuits 602c and 602d, and a third power amplifier stage ("main" or output amplifier stage) having amplifier circuit 670. Each of the two driver stages has both differential PMOS and NMOS based amplifier circuits in a cascaded but alternating fashion as shown (e.g., one branch has a PMOS amplifier circuit 602a in the first stage followed by the NMOS amplifier circuit 602c in the second stage and the other branch has an NMOS amplifier circuit 602b in the first stage followed by a PMOS amplifier circuit 602d in the second stage.

More particularly, the first stage includes a first path (e.g., branch) electrically coupled to one or more input nodes and a second path electrically coupled to the one or more input nodes. The first amplifier stage includes one or more PMOS transistors in the first path and one or more NMOS transistors in the second path. Particularly, the first path includes a first PMOS amplifier circuit 602a configured to receive a differential input signal (bias signal for the first PMOS amplifier circuit 602a as $V_{biasp1}$ is also shown). The first PMOS amplifier circuit 602a may include certain aspects of the PMOS portions of the differential amplifier circuit 502 of FIG. 5. The output of the first PMOS amplifier circuit 602a is provided to a first inter-stage matching circuit 644a (shown as a transformer but could be implemented as other reactive network of components). The second path includes a first NMOS amplifier circuit 602b configured to receive the differential input signal (bias signal for the first NMOS amplifier circuit 602b as $V_{biasn1}$ is also shown). The first NMOS amplifier circuit 602b may include certain aspects of the NMOS portions of the differential amplifier circuit 502 of FIG. 5. The output of the first NMOS amplifier circuit 602b is provided to a second inter-stage matching circuit 644b (shown as a transformer but could be implemented as other reactive network of components).

Note that DC blocking capacitors 634 are also shown providing DC blocking to the input original signal RFIN along with circuitry to show the generation of the differential input signals and bias circuitry.

The second amplifier stage includes a first path electrically coupled to the first path of the first amplifier stage and including one or more NMOS transistors in the first path of the second amplifier stage. The second amplifier stage further includes a second path electrically coupled to the second path of the first amplifier stage and including one or more PMOS transistors in the second path of the second amplifier stage. Particularly, the first path of the second amplifier stage includes a second NMOS amplifier circuit 602c configured to receive the differential signal output from the first amplifier stage via the first inter-stage matching circuit 644a in the first path (bias signal for the second NMOS amplifier circuit 602c as $V_{biasn2}$ is also shown). The second NMOS amplifier circuit 602c may include certain aspects of the NMOS portions of the differential amplifier circuit 502 of FIG. 5. The output of the second NMOS amplifier circuit 602c is provided to a third inter-stage matching circuit 646a (shown as a transformer but could be implemented as other reactive network of components). The second path of the second amplifier stage includes a second PMOS amplifier circuit 602d configured to receive the differential signal output from the first stage via the second inter-stage matching circuit 644b in the second branch (bias signal for the second PMOS amplifier circuit 602d as $V_{biasp2}$ is also shown). The second PMOS amplifier circuit 602d may include certain aspects of the PMOS portions of the differential amplifier circuit 502 of FIG. 5. The output of the second PMOS amplifier circuit 602d is provided to a fourth inter-stage matching circuit 646b (shown as a transformer but could be implemented as other reactive network of components).

The differential output signals are combined in a single path and provided to a NMOS amplifier circuit 670 having one or more NMOS transistors in a third amplifier stage (e.g., output amplifier stage). While shown as an NMOS amplifier circuit 670, in some implementations a PMOS amplifier circuit may be used. In various implementations, a non-complementary transistor configuration is used in the third amplifier stage (e.g., only NMOS transistors). The differential amplifier output out of the NMOS amplifier circuit 670 is then converted to a single-ended output signal and provided at an output RFOUT (e.g., to be provided to an antenna for transmission of the signal).

More stages are possible for other implementations.

As such the amplifier circuit topology 600 includes at least two differential branches/paths where each branch in each stage includes a PMOS based circuit and an NMOS based circuit and where for each branch there is alternating NMOS and PMOS based circuits for each stage. In certain implementations, each of the PMOS and NMOS circuits are configured having differential or quasi-differential circuit topologies using PMOS or NMOS transistors but other implementations are also possible. Stated another way, the amplifier circuit topology 600 provides complimentary amplifier driver stages using PMOS and NMOS transistors in parallel and cascaded.

The amplifier circuit topology 600 shows examples of inter-stage matching circuits 644a, 644b, 646a, 646b that may be provided between stages in each branch. Various implementations of different reactive elements may be possible. In some cases, there may be design challenges in making small inter-stage matching circuits.

Figure 7A:
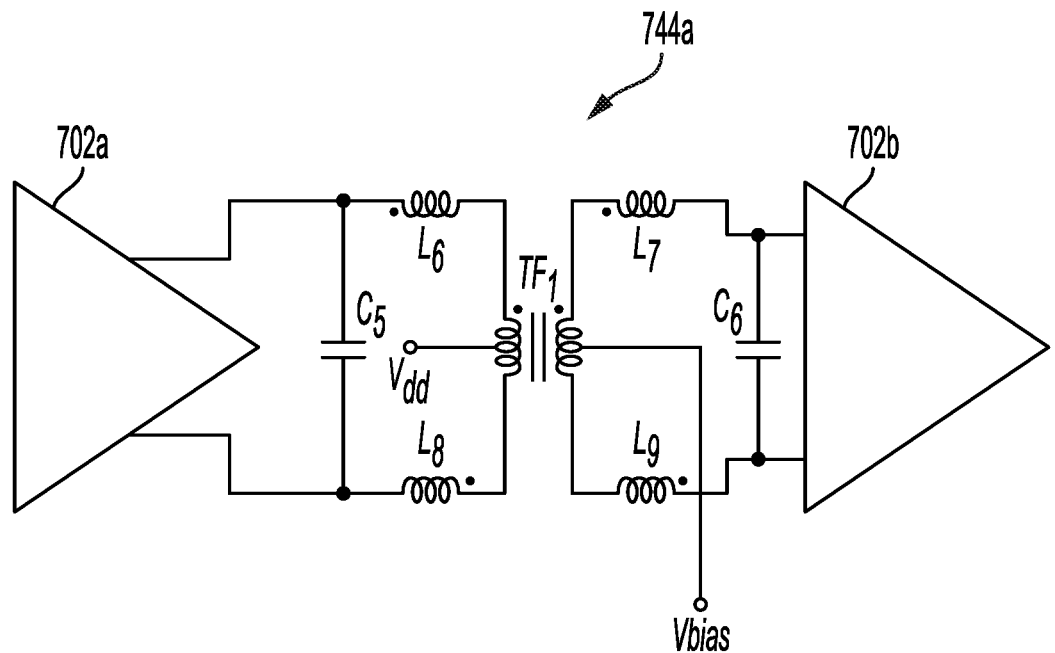
FIGS. 7A and 7B are schematic diagrams of inter-stage matching circuits that may be used for an amplifier circuit topology.
Figure 7B:
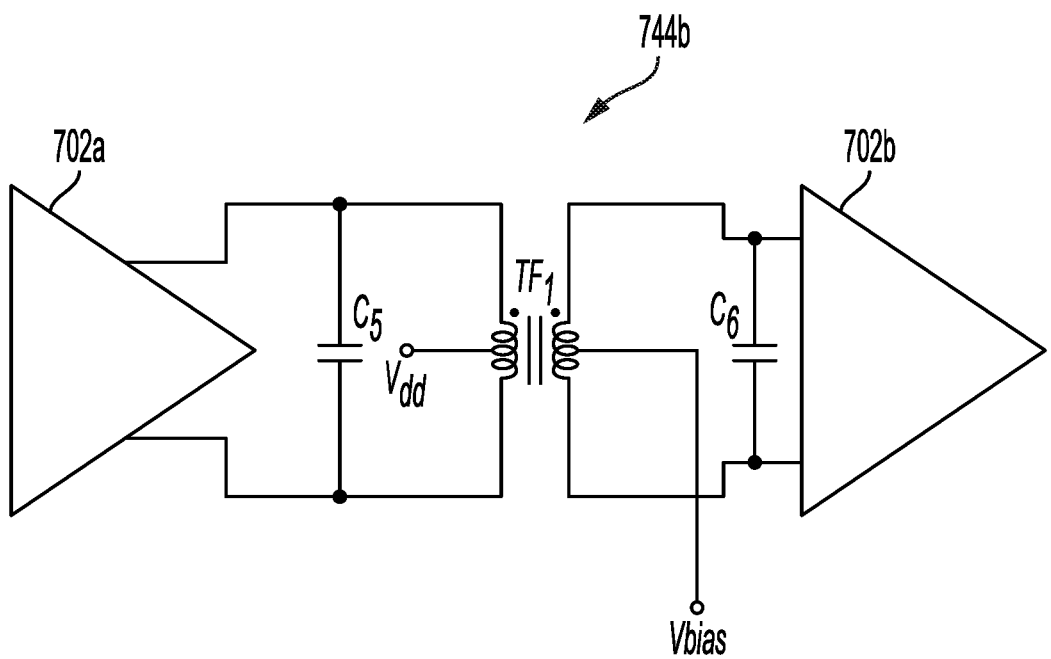

FIGS. 7A and 7B are schematic diagrams of examples of inter-stage matching circuits 744a and 744b (e.g., matching networks) that may be used within an amplifier topology between amplifier stages. The inter-stage matching circuit 744a of FIG. 7A is electrically coupled between two amplifier circuits (e.g., stages): a first amplifier circuit 702a and a second amplifier circuit 702b. These amplifier circuits 702a and 702b may be implemented based on aspects of the amplifier circuits described above with reference to FIGS. 4A-D, 5 and 6. However the amplifier circuits 702a and 702b may also be implemented with other topologies not described herein but still making use of the inter-stage matching circuit 744a as shown in FIG. 7A.

The inter-stage matching circuit 744a is a double tuned transformer having a high coupling factor k (e.g., tightly coupled) along with series leakage inductances. More particularly, the inter-stage matching circuit 744a includes a first series inductive element $L_6$ electrically coupled to a first output of the amplifier circuit 702a (e.g., to receive a first signal of a differential signal). The inter-stage matching circuit 744a further includes a second inductive element $L_8$ electrically coupled to a second output of the amplifier circuit 702a (e.g., to receive a second signal of a differential signal). The first inductive element $L_6$ is connected on one side of a primary side of a transformer $TF_1$. The second inductive element $L_8$ is connected to the other side of the primary side of the transformer $TF_1$. As such, the transformer $TF_1$ is electrically coupled in series to one side of the first inductive element $L_6$ and in series to the second inductive element $L_8$ on the other side. The primary side of the transformer $TF_1$ may be electrically coupled to a supply voltage $V_{DD}$ (or in some implementations to ground). A secondary side of the transformer $TF_1$ may be electrically coupled to a $V_{bias}$ signal. The inter-stage matching circuit 744a further includes a third inductive element $L_7$ electrically coupled between one side of a secondary side of the transformer $TF_1$ and a first input of the second amplifier circuit 702b. The inter-stage matching circuit 744a further includes a fourth inductive element $L_9$ electrically coupled between the other side of the secondary side of the transformer $TF_1$ and a second input of the second amplifier circuit 702b (first and second inputs for a differential signal). Capacitors $C_5$ and $C_6$ may also be included and may be connected in parallel with the transformer $TF_1$. The inductive elements L6 and L8 may be configured to be inductively coupled to each other to have a mutual inductance that allows for reducing the size of the components. Likewise, the inductive elements L7 and L9 may be configured to be inductively coupled to each other. The configuration of the inter-stage matching circuit 744a may allow for using a more tightly coupled transformer which may be smaller in size than other implementations that may rely on more loosely coupled transformers that may require more space.

The inter-stage matching circuit 744b of FIG. 7B is electrically coupled between two amplifier circuits (e.g., stages): a first amplifier circuit 702a and a second amplifier circuit 702b. As noted above with respect to FIG. 7A, the amplifier circuits 702a and 702b may be implemented based on aspects of the amplifier circuits described above with reference to FIGS. 4A-D, 5 and 6. However the amplifier circuits 702a and 702b may also be implemented with other topologies not described herein but still making use of the inter-stage matching circuit 744b as shown in FIG. 7B.

The inter-stage matching circuit 744b includes a transformer $TF_1$. The primary side of the transformer $TF_1$ is electrically coupled in series on one side to an output of the amplifier circuit 702a (e.g., electrically coupled to a drain terminal of a transistor) and electrically coupled in series on the other side to an output of the amplifier circuit 702a (e.g., electrically coupled to a drain terminal of a transistor). A secondary side of the transformer $TF_1$ is electrically coupled to at least one of the output amplifier stage or another stage of the one or more amplifier stages (e.g., each side of the secondary side of the transformer $TF_1$ may be couple do to a gate terminal of a transistor in the next stage) The primary side of the transformer $TF_1$ may be electrically coupled to a supply voltage $V_{DD}$ (or in some implementations to ground). A secondary side of the transformer $TF_1$ may be electrically coupled to a $V_{bias}$ signal. Capacitors $C_5$ and $C_6$ may also be included and may be connected in parallel with the transformer $TF_1$.

Figure 8A:
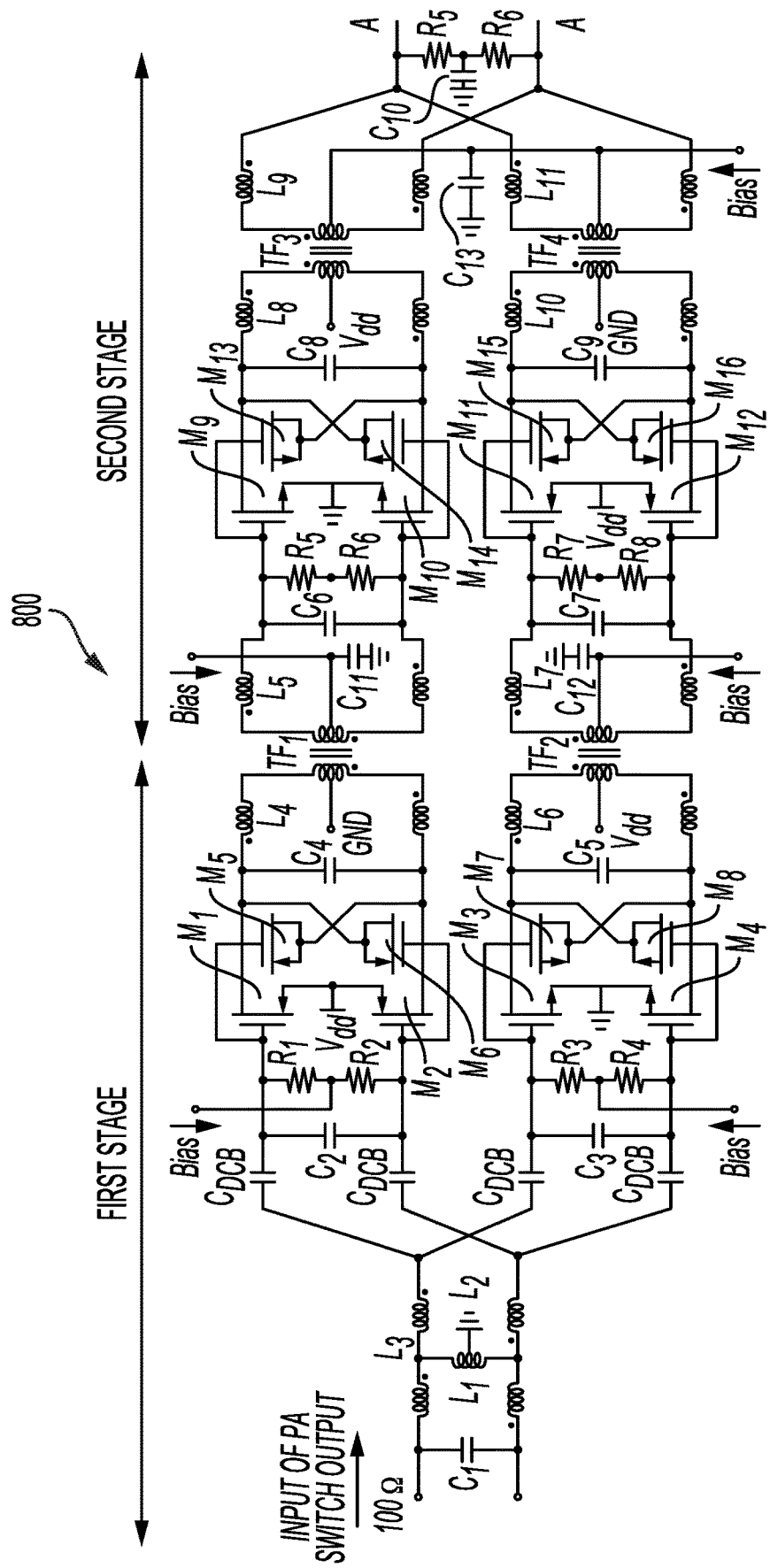
FIG. 8A is a schematic diagram of an example of an implementation of the multi-stage amplifier circuit topology of FIG. 6.

FIG. 8A is a schematic diagram of an example of an implementation of the multi-stage amplifier circuit topology 600 of FIG. 6. The amplifier circuit topology 800 shows an example implementation of the first two stages of the amplifier circuit topology 600 of FIG. 6 along with incorporation of the inter-stage matching circuit 744a as shown with respect to FIG. 7A. In particular, an example of the first PMOS amplifier circuit 602a of FIG. 6 is shown in the amplifier circuit topology 800 of FIG. 8A including a first PMOS transistor M1 and a second PMOS transistor M2 in a first path. The gate terminal of the first PMOS transistor M1 is electrically coupled to a first input node configured to receive a first signal of a differential signal. The gate terminal of the second PMOS transistor M2 is electrically coupled to a second input node configured to receive a second signal of the differential signal. The source terminals of the first and second PMOS transistors M1 and M2 are each electrically coupled to a supply voltage $V_{DD}$. The drain terminals of the first and second PMOS transistors M1 and M2 are electrically coupled through respective inductive impedance elements L4 to ground. Transistors M5 and M6 are included and electrically coupled in a manner to compensate for the $C_{GD}$ of the M1 and M2 transistors.

An inter-stage matching circuit as shown in FIG. 7A is connected at the output of the drain terminals of M1 and M2.

Furthermore, an example of the first NMOS amplifier circuit 602b of FIG. 6 is shown in the amplifier circuit topology 800 of FIG. 8A including a first NMOS transistor M3 and a second NMOS transistor M4 in a second path. The gate terminal of the first NMOS transistor M3 is electrically coupled to the first input node configured to receive the first signal of the differential signal. The gate terminal of the second NMOS transistor M4 is electrically coupled to the second input node configured to receive the second signal of the differential signal. The drain terminals of the first and second NMOS transistors M3 and M4 are electrically coupled through inductive impedance elements L6 to a supply voltage $V_{DD}$. The source terminals of the first and second NMOS transistors M3 and M4 are electrically coupled to ground. Transistors M7 and M8 are included and electrically coupled in a manner to compensate for the $C_{GD}$ of the M3 and M4 transistors. An inter-stage matching circuit as shown in FIG. 7A is connected at the output of the drain terminals of M1 and M2.

Furthermore, an example of the second NMOS amplifier circuit 602c of FIG. 6 is shown in the amplifier circuit topology 800 of FIG. 8A. The amplifier circuit 800 includes a third NMOS transistor M9 and a fourth NMOS transistor M10 in the second stage along the first path. The gate terminals of each of the third and fourth NMOS transistors M9 and M10 are respectively electrically coupled to first and second output signals of a differential signal output from the first stage via the inter-stage matching circuit. The source terminals of the third and fourth NMOS transistors M9 and M10 are each electrically coupled to ground. The drain terminals of the third and fourth NMOS transistors M9 and M10 are electrically coupled through inductive impedance elements L8 to a supply voltage $V_{DD}$. Transistors M13 and M14 are included and connected in a manner to compensate the $C_{GD}$ of the M9 and M10 transistors. An inter-stage matching circuit as shown in FIG. 7A is connected at the output of the drain terminals of M9 and M10.

Furthermore, an example of the second PMOS amplifier circuit 602d of FIG. 6 is shown in the amplifier circuit topology 800 of FIG. 8A. The amplifier circuit 800 includes a third PMOS transistor M11 and a fourth PMOS transistor M12 in the second stage along the second path. The gate terminals of each of the third and fourth PMOS transistors M11 and M12 are respectively electrically coupled to first and second output signals of a differential signal output from the first stage (along the second path) via the inter-stage matching circuit. The source terminals of the third and fourth PMOS transistors M11 and M12 are each electrically coupled to a supply voltage $V_{DD}$. The drain terminals of the third and fourth PMOS transistors M11 and M12 are each electrically coupled through inductive impedance elements L10 to ground. Transistors M15 and M16 are included and connected in a manner to compensate for the $C_{GD}$ of the M11 and M12 transistors. These compensation elements improve power amplifier stage $S_{12}$, power amplifier stability, and reduce power amplifier distortions, especially AMPM, when the amplifier topology operates at low current density bias conditions (e.g. Class-AB or Class-B). An inter-stage matching circuit as shown in FIG. 7A is connected at the output of the drain terminals of M11 and M12.

Figure 8B:
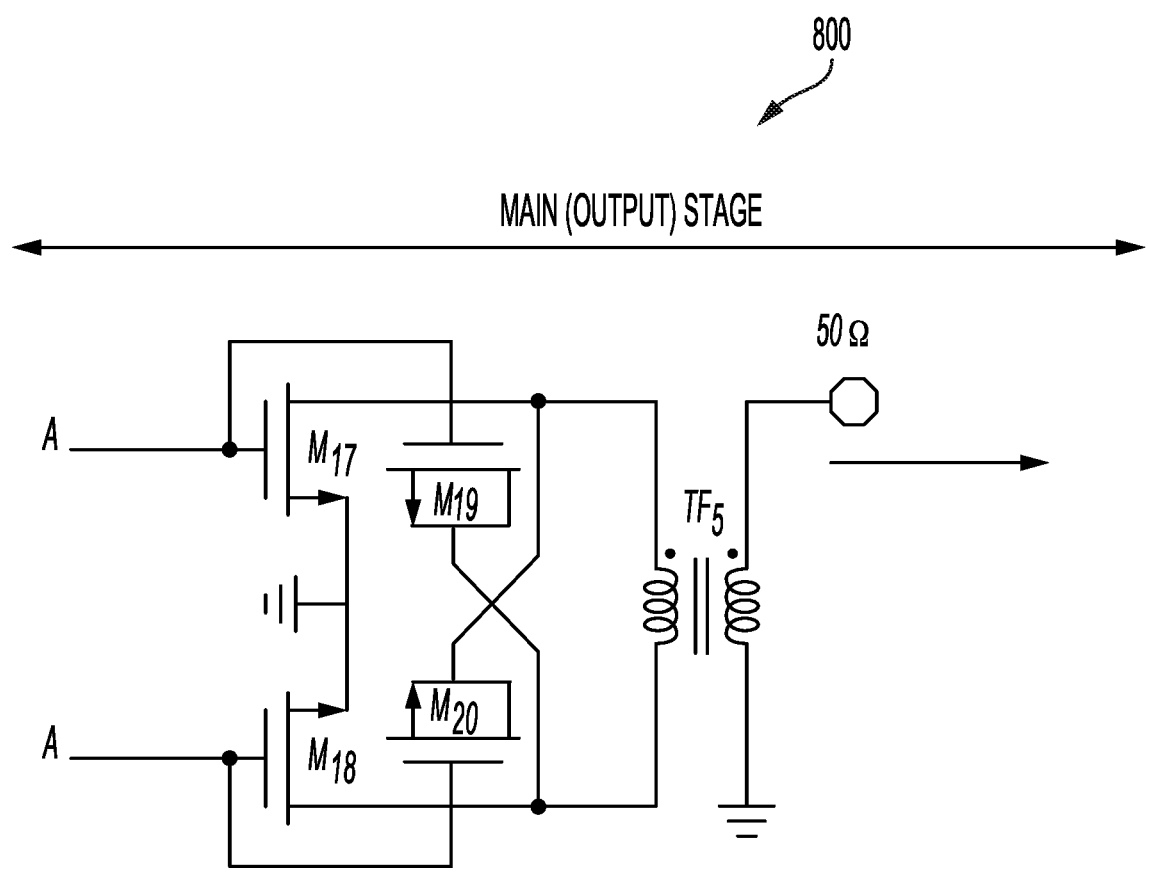
FIG. 8B is a schematic diagram of a power amplifier stage of the amplifier circuit topology of FIG. 8A.

To improve the AMPM further, in an implementation, a second harmonic termination is built into the inter-stage matching circuit of the differential amplifier 800. In FIG. 8A, C13 appears in series with the common mode inductance presented by the combined network formed by TF3, L9, TF4 and L11 (e.g., at a center tap of an inductor). By sweeping the value of C13 in simulation, the common mode impedance presented at node A at approximately the $2^{nd}$ harmonic of the amplifier operation frequency can be reduced. As such, in one implementation C13 has a value that forms a common mode short at substantially the second harmonic of the amplifier operating frequency. This suppresses common mode feedback of the amplifier $2^{nd}$ harmonic from the output stage drains to the output stage gates as shown in FIG. 8B and improves both AMPM and reduces memory effects observable as frequency dependent IM3. In this context, the approximate $2^{nd}$ harmonic is any frequency that is double a frequency in the designed operating range of the amplifier circuit 800. For example, for an amplifier designed to operate from 26.5 to 29.5 GHz, the approximate second harmonic would be anywhere in the range 53 to 59 GHz. In an aspect of another implementation, similar second harmonic traps may also be implemented by C11 in series with the network formed by TF1 and L5, and C12 in series with the network formed by TF2 and L7. It is understood that the unlabeled inductors in FIG. 8A are part of the labeled inductor that is attached to the same transformer winding.

FIG. 8B is a schematic diagram of an output or "main" amplifier stage (e.g., power amplifier stage) of the amplifier circuit topology of FIG. 6. FIG. 8B continues the amplifier circuit topology 800 of FIG. 8A (connection shown by 'A' terminals) showing the output amplifier stage of the amplifier circuit topology 800. The output amplifier stage includes a first NMOS transistor M17 having a gate terminal electrically coupled to a first input signal of a differential signal that is formed by combining signals from the first and second paths of the second amplifier stage. The drain terminal of the first NMOS transistor M17 of the output amplifier stage is electrically coupled to an output transformer $TF_5$ (e.g., may be a balun for converting to single-ended signal for an antenna). The source terminal of the first NMOS transistor M17 of the output amplifier stage is electrically coupled to ground. The output amplifier stage includes a second NMOS transistor M18 having a gate terminal electrically coupled to a second input signal of the differential signal that is formed by combining signals from the first and second paths of the second amplifier stage. The drain terminal of the second NMOS transistor M18 of the output amplifier stage is electrically coupled to the output transformer $TF_5$. The source terminal of the second NMOS transistor M18 of the output amplifier stage is electrically coupled to ground. The transformer $TF_5$ is configured to provide a single-ended output signal (e.g., for providing to an antenna). However, in other implementations a differential output may also be possible. Transistors M19 and M20 are also included and connected in a manner to compensate for the $C_{GD}$ of the M17 and M18 transistors and improve differential mode reverse isolation.

The first and second stages of the amplifier circuit topology 800 use the complimentary transistor configuration (e.g., NMOS/PMOS) to improve linearity. The main stage uses the non-complementary transistor configuration (e.g., NMOS) to increase power added efficiency. As described above with respect to FIG. 6 and now with FIGS. 8A and 8B, the two first driver stages include two signal paths of PMOS to NMOS and NMOS to PMOS. As a result, the phase differences are similarly retained for both paths/branches. The paths are combined before the main amplifier stage as shown in FIGS. 8A and 8B. In some cases, the size of transistors for both the PMOS and NMOS transistors are sized to be the same (although this isn't always the case in some other implementations) and may be biased differently. As one example for purposes of illustration only, NMOS transistor cores of M13 and M14 in the second stage may use 28 nm NMOS LVT devices and the size of transistors is, for example, 30 nm (length)×1 um (width)×32 (fingers)×3 (multiples) for each differential power cell (30 nm gate length with total 96 um gate width for M13 and M14, hence 192 um for the differential). Similar with the NMOS transistor cores, PMOS transistor cores of M11 and M12 may use 28 nm NMOS LVT devices and the size of transistors is 30 nm (length)×1 um (width)×32 (fingers)×3 (multiples) for each differential one (30 nm gate length with total 96 um gate width for M11 and M12, hence 192 um for the differential). These complimentary transistors are used for increasing the amplifier linearity, especially AMPM, at low power levels.

Furthermore, in the first stage, the gates of the PMOS (M1 and M2) and NMOS (M3 and M4) are AC-shorted through capacitor $C_{DCB}$ and the non-linearity behaviors of the $C_{gs}$ are properly cancelled while input signals of the amplifier circuit topology 800 are overdriven. The $C_{DCB}$ is used as a DC blocking capacitor (1 pF) at ~30 GHz, and the gate biases for each NMOS and PMOS are supplied through the resistors (R1-R4).

The inter-stage matching circuits used in FIG. 8A and described with respect to FIG. 7A may cover a bandwidth of greater than e.g., 3.8 GHz (e.g., more than 10% around a center of a possible operating frequency such as 28 GHz). While the amplifier circuit 800 incorporates inter-stage matching circuits as described with respect to FIG. 7A, the amplifier circuit 800 of FIGS. 8A and 8B may also incorporate the inter-stage matching circuit 744b of FIG. 7B (for example, the inductors L4 and L6 (on both sides of the transformers $TF_1$ and TF2 may be replaced by shorts such that the drain terminals of the transistors M1, M2, M3, and M4 are electrically coupled respectively to the transformers $TF_1$ and $TF_2$).

It should be appreciated that when two elements are described as electrically coupled, in certain implementations there may exist intervening elements between the two elements. In addition, in an aspect, electrically coupled may refer to two elements being electrically connected to each other.

In an aspect, a method for amplifying a signal in an amplifier circuit 600 may be provided. The method is described with reference to the amplifier circuit 600 of FIG. 6, however, the method may be applied to other implementations described herein. The method includes amplifying the signal using a first amplifier stage having a first path electrically coupled to one or more input nodes and a second path electrically coupled to the one or more input nodes. The first amplifier stage includes one or more PMOS transistors (PMOS amplifier circuit 602a) in the first path and one or more NMOS transistors (NMOS amplifier circuit 602b) in the second path.

The method further includes amplifying the signal using a second amplifier stage having a first path electrically coupled to the first path of the first amplifier stage and including one or more NMOS transistors in the first path. The second amplifier stage has a second path electrically coupled to the second path of the first amplifier stage and includes one or more PMOS transistors in the second path.

The method further includes amplifying the signal using an output amplifier stage electrically coupled to the second amplifier stage and further electrically coupled to both the first path and the second path of the second amplifier stage to form a common path for the output amplifier stage. The output amplifier stage includes a non-complementary transistor configuration (e.g., one or more NMOS transistors (NMOS amplifier circuit 670)).

In another aspect of the disclosure, the output amplifier stage shown in FIGS. 8A and 8B (or output amplifier stage 4C, 4D, and 6) may be biased differently based on a particular operating condition (the bias voltage, 'Bias' is shown in FIG. 8A for the output stage on FIG. 8B). For example, in one mode where there is less sensitivity to linearity, the output stage may be biased in a first bias mode (e.g., corresponding to a particular gate bias voltage). In a particular example, the first bias mode may correspond to a class AB bias. In, another mode, where more linearity is desired, then the output stage is biased in a second bias mode (different from the first—e.g., corresponding to another particular gate bias voltage. In a particular example, the second bias mode may correspond to a class A biasing mode (or approaching class A).

The biasing modes may be determined based on the modulation order/scheme being used. For example, there may be a degradation in linear output power for a modulation scheme such as 64 QAM OFDM relative to QPSK OFDM or QPSK SCFDM (e.g., the same degradation in linearity is negligible or does not occur for QPSK OFDM or QPSK SCFM modulation orders). Adjusting the bias to increase linearity (e.g., by increasing the gate bias voltage for 64 QAM OFDM to increase the current density in the amplifier transistors) can partially reduce the degradation in linear output power. However, since any degradation is negligible for the QPSK OFDM and QPSK SCFDM, the adjustment of the bias in the same way does not need to occur. As such, the amplifier bias for the main output stage, in accordance with an implementation, is configured to be different based on an operating condition (e.g., modulation scheme). While the discussion has provided examples for particular modulation schemes such as 64 QAM and QPSK, the above may be equally applicable to other modulation schemes where linearity issues may be different from one other and therefore adjustable biasing may occur.

In an aspect of the disclosure, a method is provided to bias a portion of an amplifier circuit (e.g., the power amplifier stage of the amplifier circuit or 'main' stage as shown in FIG. 8B). The method is described with reference to the amplifier circuit 800 of FIG. 8A but may be applied to any of the amplifier circuits described herein (e.g., output stages in FIGS. 4C, 4D, and 6). The method may include determining an operating condition of the amplifier circuit 800 (or more generally an operating condition of a transmit circuit including the amplifier circuit 800). Determining the operating condition may include determining a modulation scheme used for modulating data configured to be provided through the amplifier circuit 800. The method may further include determining a bias signal magnitude for the portion of the amplifier circuit 800 based on the operating condition. If the operating condition corresponds to a modulation scheme, the method may include determining the bias signal magnitude for the portion of the amplifier circuit 800 based on the modulation scheme. The method may then include providing the determined bias signal to the portion of the amplifier circuit. In some aspects, the modulation scheme may be a 64 QAM OFDM scheme. In an aspect, the method may include increasing a gate bias voltage in response to determining the modulation scheme is the 64 QAM OFDM scheme, where the gate bias voltage is increased relative to a gate bias voltage used for other modulation schemes different than the 64 QAM OFDM (e.g., the gate bias voltage is higher when using the 64 QAM OFDM scheme versus the voltage used for a QPSK modulation scheme). In some cases, there may be a default bias based on a relative more efficient bias mode (e.g., class AB) that may be use for multiple modulation schemes. When a particular modulation scheme is detected/determined to be in use (e.g., 64 QAM), then the bias is adjusted from the default to a more linear bias scheme (potentially less efficient relative to the default).

Figure 9A:
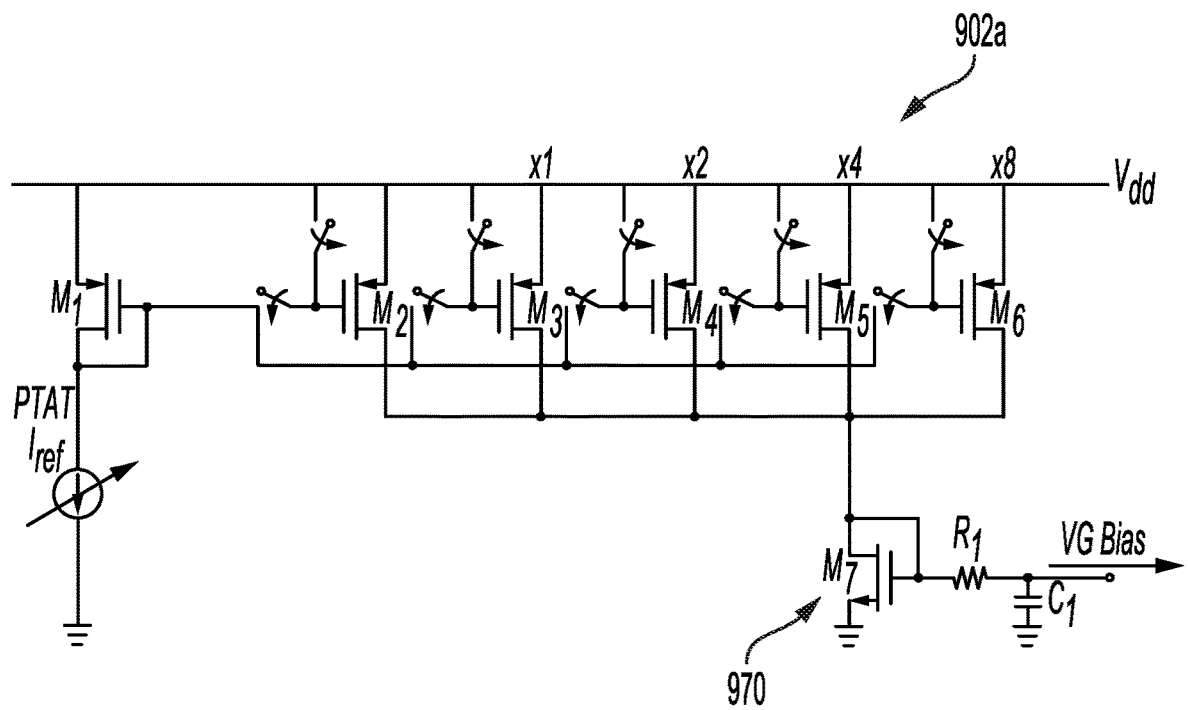
FIGS. 9A, 9B, and 9C are schematic diagrams of circuits configured to provide a variable/adjustable bias voltage to one or more of the transistors in the amplifier circuits shown in FIGS. 8A and 8B.
Figure 9B:
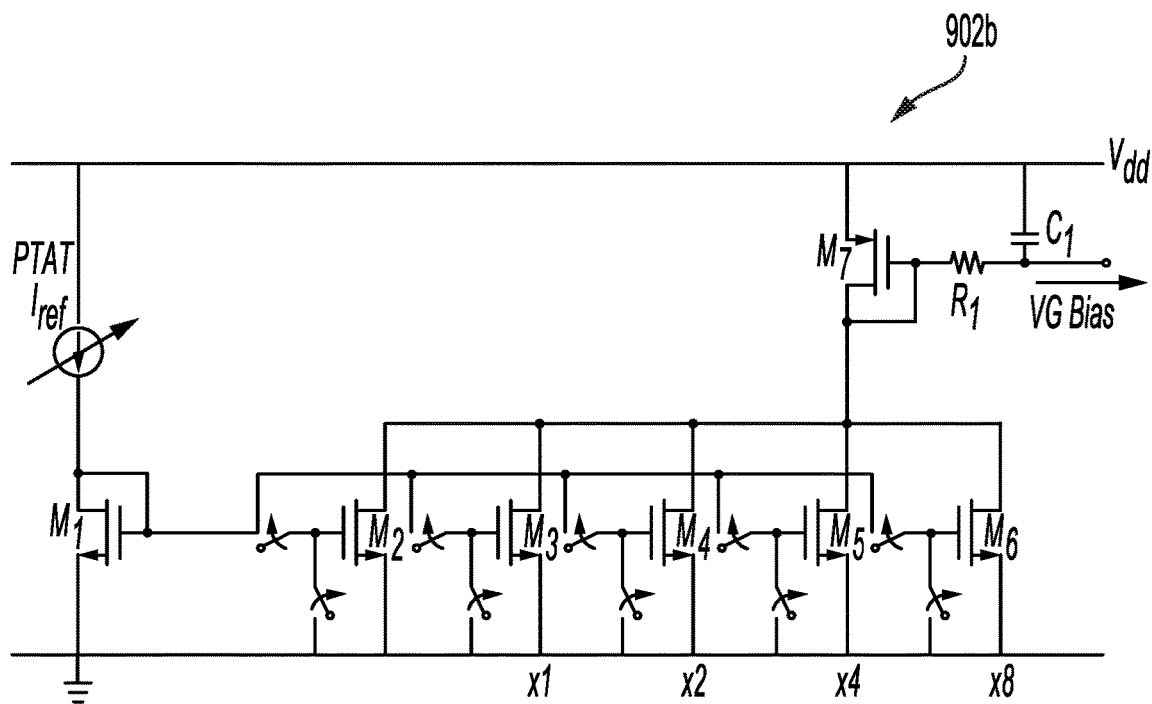
Figure 13:
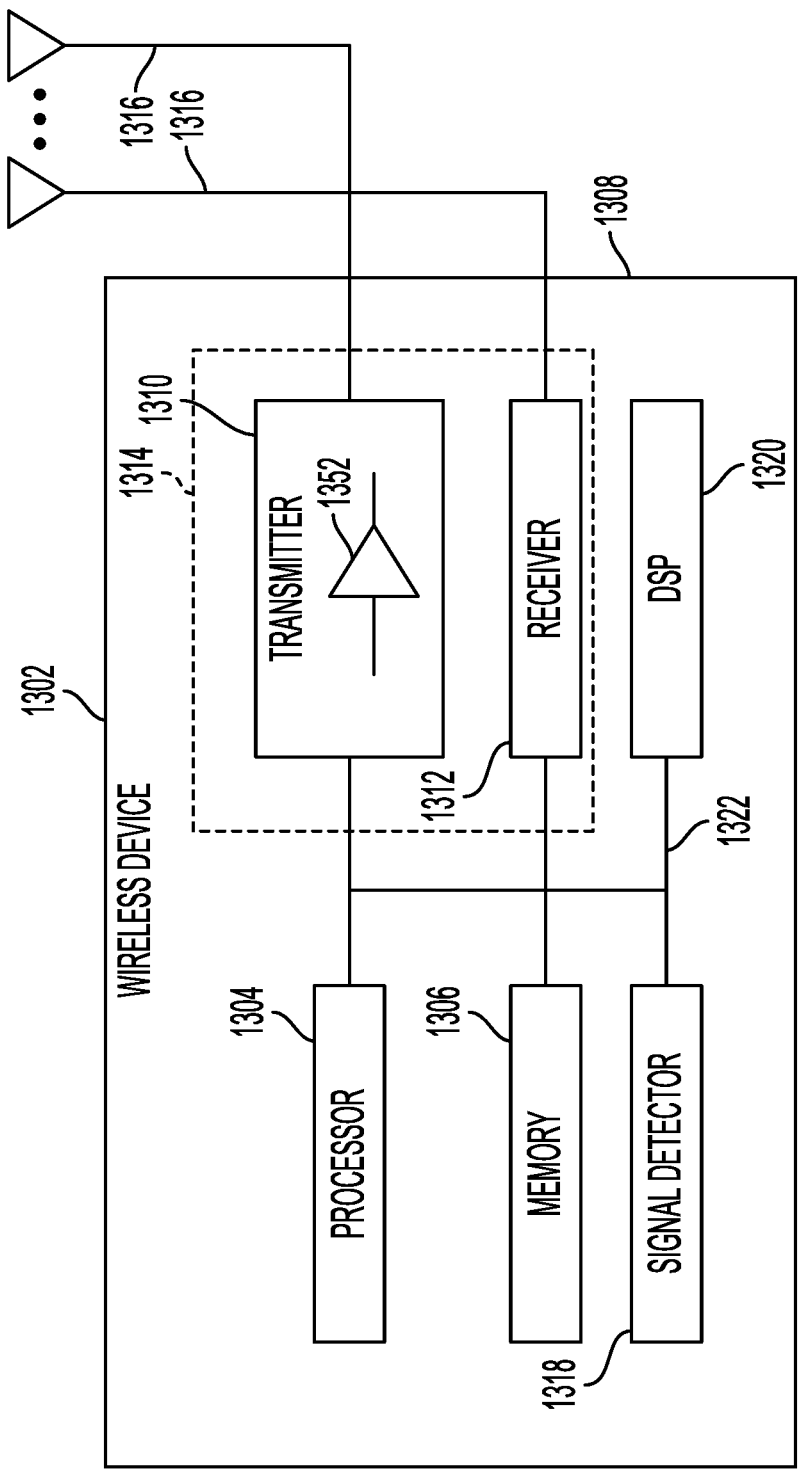
FIG. 13 is a functional block diagram of wireless device configured to transmit or receive wireless communications that may incorporate circuit topologies discussed with respect to FIGS. 4A-C, 5, 6, 7A, 7B, 8A, 8B, 9A, 9B, 9C, and 10.

FIGS. 9A and 9B include examples of circuits configured to provide a variable/adjustable bias voltage to one or more of the transistors in the amplifier circuits 800 shown in FIGS. 8A and 8B. FIG. 9A is an example of a tuning circuit 902a configured to adjust the gate bias for one of the NMOS transistors of the amplifier circuit 800 shown in FIGS. 8A and 8B. FIG. 9B is an example of a tuning circuit 902b configured to adjust the gate bias for one of the PMOS transistors of the amplifier circuit 800 shown in FIGS. 8A and 8B. The outputs VG Bias are referred to as Bias, Viasn, and Vbiasp in FIGS. 8A and 8B. Each of the tuning circuits 902a and 902b illustrates a plurality of transistors that may be selectively connected into the circuit to provide different VG Bias outputs (e.g., each including a 5-bit current mirror). As such a controller circuit (not shown but examples/description of which are shown in FIG. 13) is configured to determine the bias voltage to apply based on the criteria described above with respect to the operating condition (e.g., modulation scheme) and control the switches of the tuning circuits 902a or 902b of either FIG. 9A or 9B to adjust the VG Bias output to a desired/pre-determined level. Other implementations with other variable tuning elements may also be possible for other contemplated implementations as FIGS. 9A and 9B are provided for illustrating a tuning circuit that may be used.

Figure 9C:
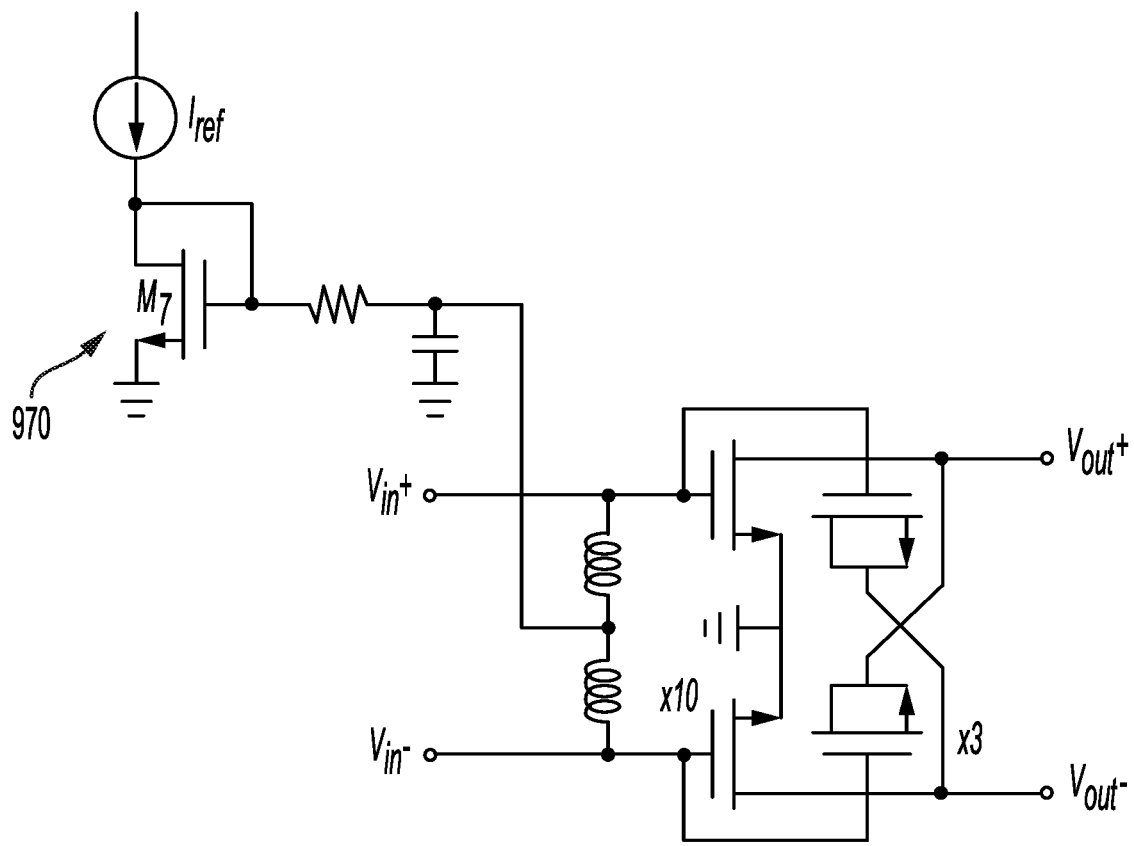

In particular, FIG. 9A may be an example of a tuning circuit 902a that may be used to provide an adjustable bias voltage to the transistors M17 and M18 in the main stage of the amplifier circuit topology 800 shown in FIG. 8B. FIG. 9C illustrates how the tuning circuit 902a of FIG. 9A may be connected to provide the bias voltage to the main stage of the amplifier circuit 800 as shown in FIG. 8B where the transistor M7 in FIG. 9A may correspond to the transistor 970 in FIG. 9C that is connected to an amplifier circuit that corresponds to the main stage of the amplifier circuit 800 as shown in FIG. 8B. As such, a variable bias voltage may be applied to the main output stage based on various modes that may depend on an operating condition (e.g., modulation scheme) used for transmission. Variable bias may also be applied to the driver amplifier stages (e.g., stage one and stage two) as shown in FIG. 8A or amplifiers 602a, 602b, 602c, 602d of FIG. 6.

Figure 11:
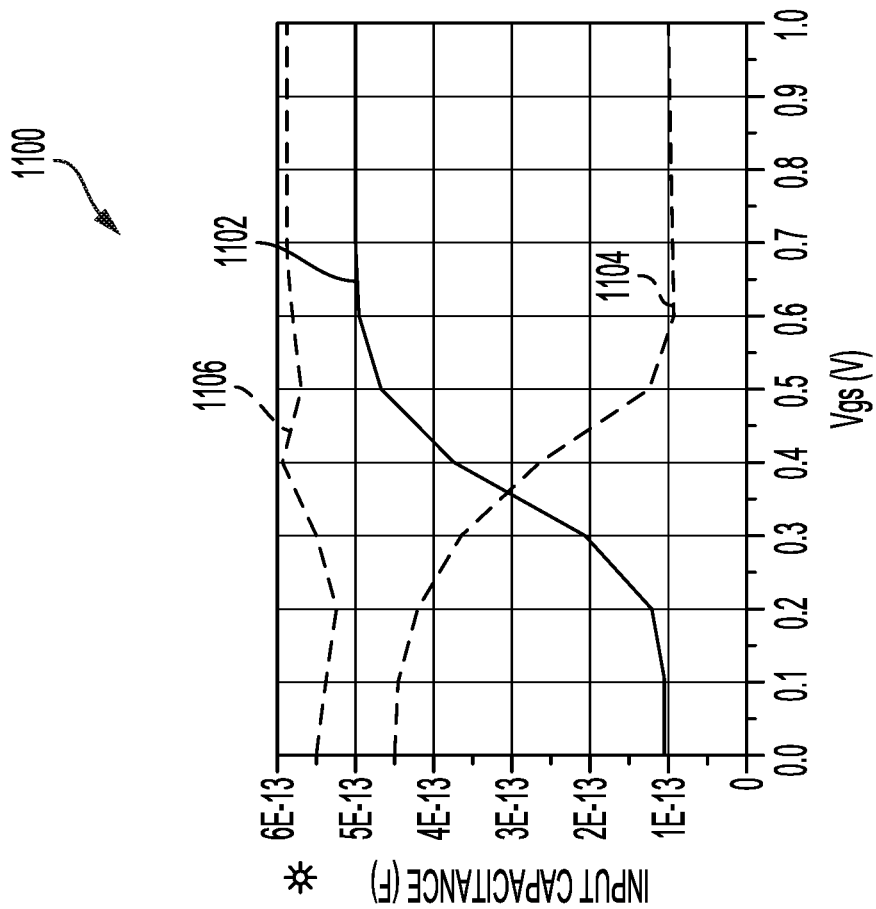
FIG. 11 is a plot illustrating input capacitance values as a function of a gate to source voltage of the NMOS transistors in FIG. 10.
Figure 10:
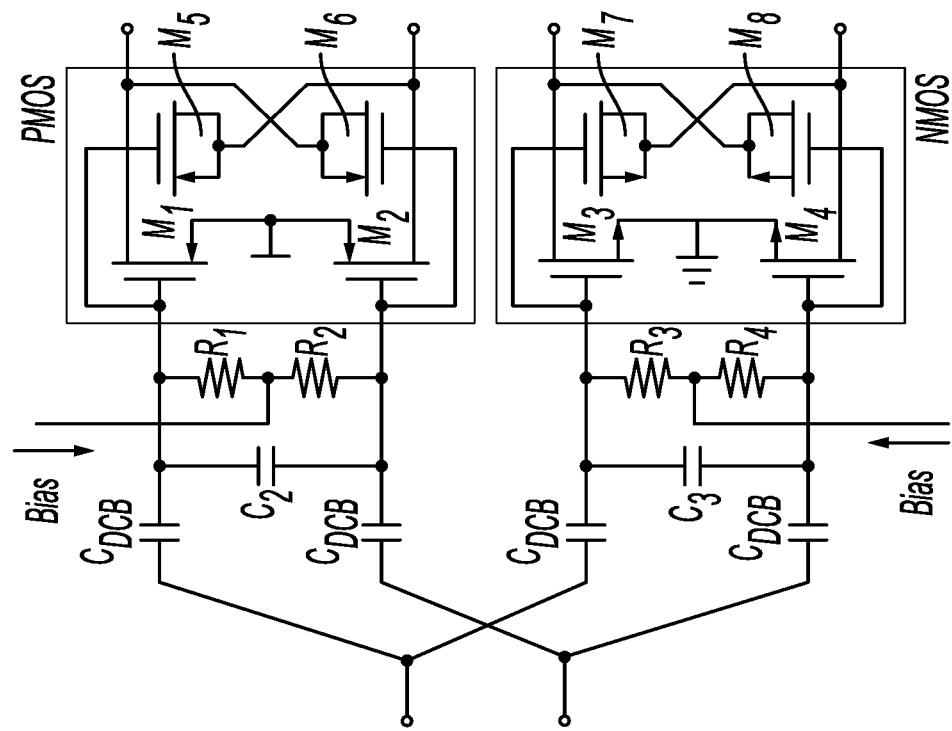
FIG. 10 is a schematic diagram of a portion of the amplifier circuit topology of FIG. 8A.

FIG. 10 is a schematic diagram of a portion of the amplifier circuit topology 800 of FIG. 8A. The portion is a reproduction of the first stage as shown in FIG. 8A and is provided for purposes of illustrating certain advantages of this topology. FIG. 11 is a plot 1100 illustrating input capacitance values as a function of a gate to source voltage of the NMOS transistors M3 and M4 in FIG. 10. The configuration shown may have improved linearity at low power levels, although the amplifier current density (bias condition) may be near sub-threshold regions (e.g. Class-AB). Non-linear Cgs may be a significant contributor, while input signals are overdriven. The amplifier circuit 800 may start causing the AMPM distortions at low power levels. The amplifier circuit 800 uses the two paths using NMOS (M3 and M4) and PMOS (M1 and M2), and properly cancel out Cgs non-linearity as shown in FIG. 11. The curve 1102 shows NMOS input capacitance variances over different Vg bias conditions, and the curve 1104 shows PMOS input capacitance variances, respectively. In the plot, PMOS biases are adjusted to obtain the flat responses shown by curve 1106. This configuration may improve AMAM and AMPM and the behavior is adequate and similar to other designs for power added efficiency (PAE).

The amplifier circuit topologies described above may be particularly useful to satisfy requirements for a phased array system (e.g., for future 5G applications that may provide improved beam-forming and for high bandwidth frequencies). In addition, higher output power (e.g., greater than 7 dBm) may be desirable for different modulation types at higher frequencies with an EVM spec of −28 dB for 64QAM OFDM signals. At this condition, the PAE of greater than 10% is demanded. To achieve these specs, a class-AB differential power amplifier designs with high efficiency balun as described herein is desirable.

Figure 12:
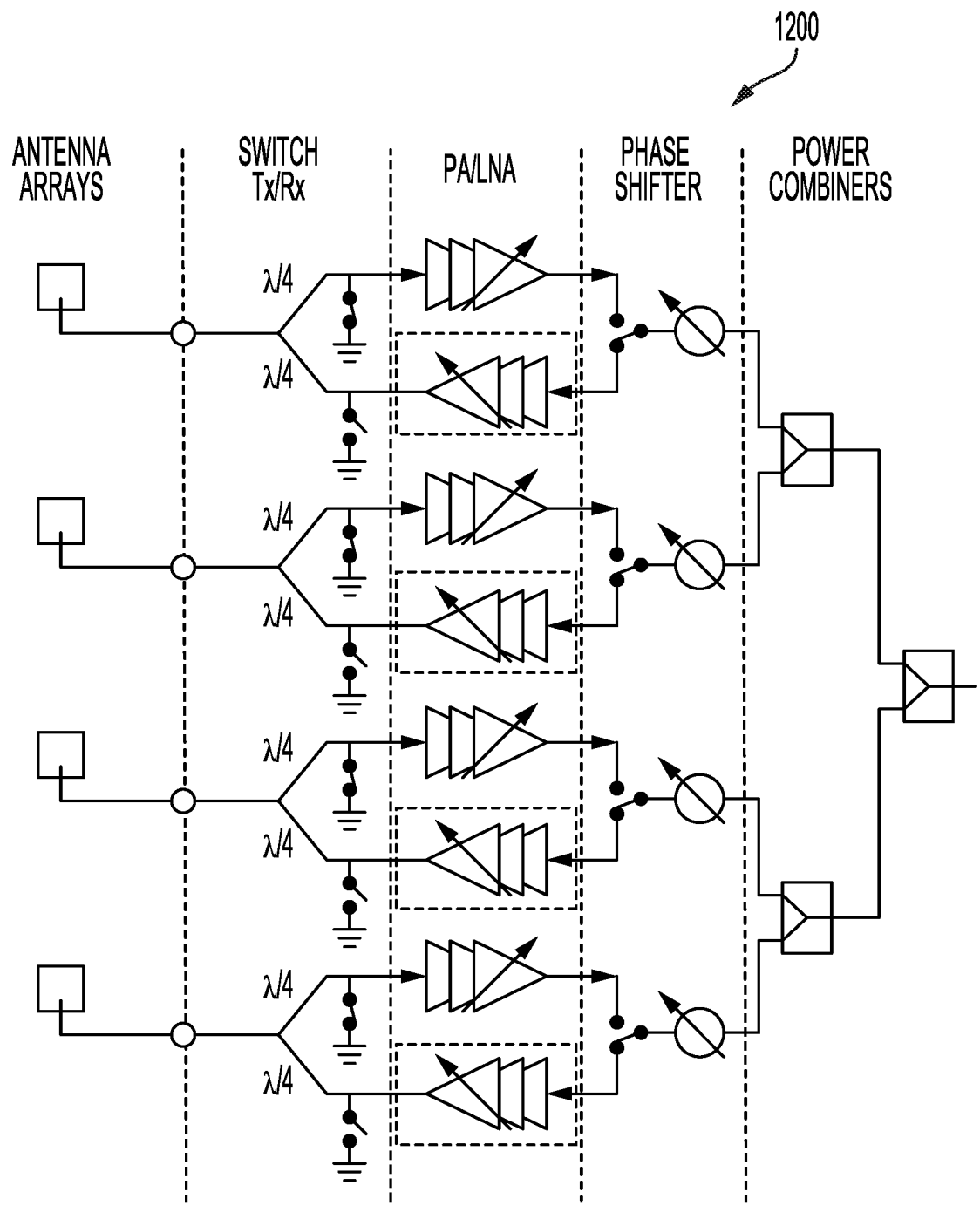
FIG. 12 is a functional block diagram of a transceiver circuit topology with a phase array for a mmWave application that may incorporate one or more aspects of the amplifier topologies discussed with respect to FIGS. 4A-C, 5, 6, 7A, 7B, 8A, 8B, 9A, 9B, 9C, and 10.

FIG. 12 is a functional block diagram of a portion of a transceiver circuit topology with a phase array for a mmWave application that may incorporate one or more aspects of the amplifier topologies discussed with respect to FIGS. 4A-C, 5, 6, 7, 8A, 8B, and 9A-C. The phased array transceiver circuit 1200 is shown to illustrate an application where the amplifier circuits described herein may be used. The dotted boxes show examples of a plurality of amplifier circuits (transmit amplifiers) where aspects of the amplifier topologies may be incorporated into a phased array. The phased array transceiver may be used for beamforming applications (e.g., particularly in mmWave applications where it may be desirable to increase the range (and therefore output power levels) by steering the signal to increase power levels).

FIG. 13 is a functional block diagram of wireless device 1302 configured to transmit or receive wireless communications that may incorporate circuit topologies discussed with respect to FIGS. 4A-C, 5, 6, 7, 8A, 8B, 9A-C, and 12. The wireless device 1302 is an example of a device that may be configured to implement the various circuits methods described herein. The wireless device 1302 may be an access point or a user terminal.

The wireless device 1302 may include a processor 1304 which controls operation of the wireless device 1302. The processor 1304 may also be referred to as a central processing unit (CPU). Memory 1306, which may include both read-only memory (ROM) and random-access memory (RAM), provides instructions and data to the processor 1304. A portion of the memory 1306 may also include non-volatile random-access memory (NVRAM). The processor 1304 typically performs logical and arithmetic operations based on program instructions stored within the memory 1306. The instructions in the memory 1306 may be executable to implement the methods described herein.

The wireless device 1302 may also include a housing 1308 that may include a transmitter 1310 and a receiver 1312 to allow transmission and reception of data between the wireless device 1302 and a remote location. The transmitter 1310 and receiver 1312 may be combined into a transceiver 1314. A plurality of transmit antennas 1316 may be attached to the housing 1308 and electrically coupled to the transceiver 1314. Furthermore, the transmitter and receiver may share one or more antennas. The wireless device 1302 may also include (not shown) multiple transmitters, multiple receivers, and multiple transceivers. The transmitter 1310 may further include an amplifier circuit 1352 that may be configured as one of the amplifier topologies described herein. The wireless device 1302 may also include a signal detector 1318 that may be used in an effort to detect and quantify the level of signals received by the transceiver 1314. The signal detector 1318 may detect such signals as total energy, energy per subcarrier per symbol, power spectral density and other signals. The wireless device 1302 may also include a digital signal processor (DSP) 1320 for use in processing signals.

The various components of the wireless device 1302 may be coupled together by a bus system 1322, which may include a power bus, a control signal bus, and a status signal bus in addition to a data bus.

Figure 14:
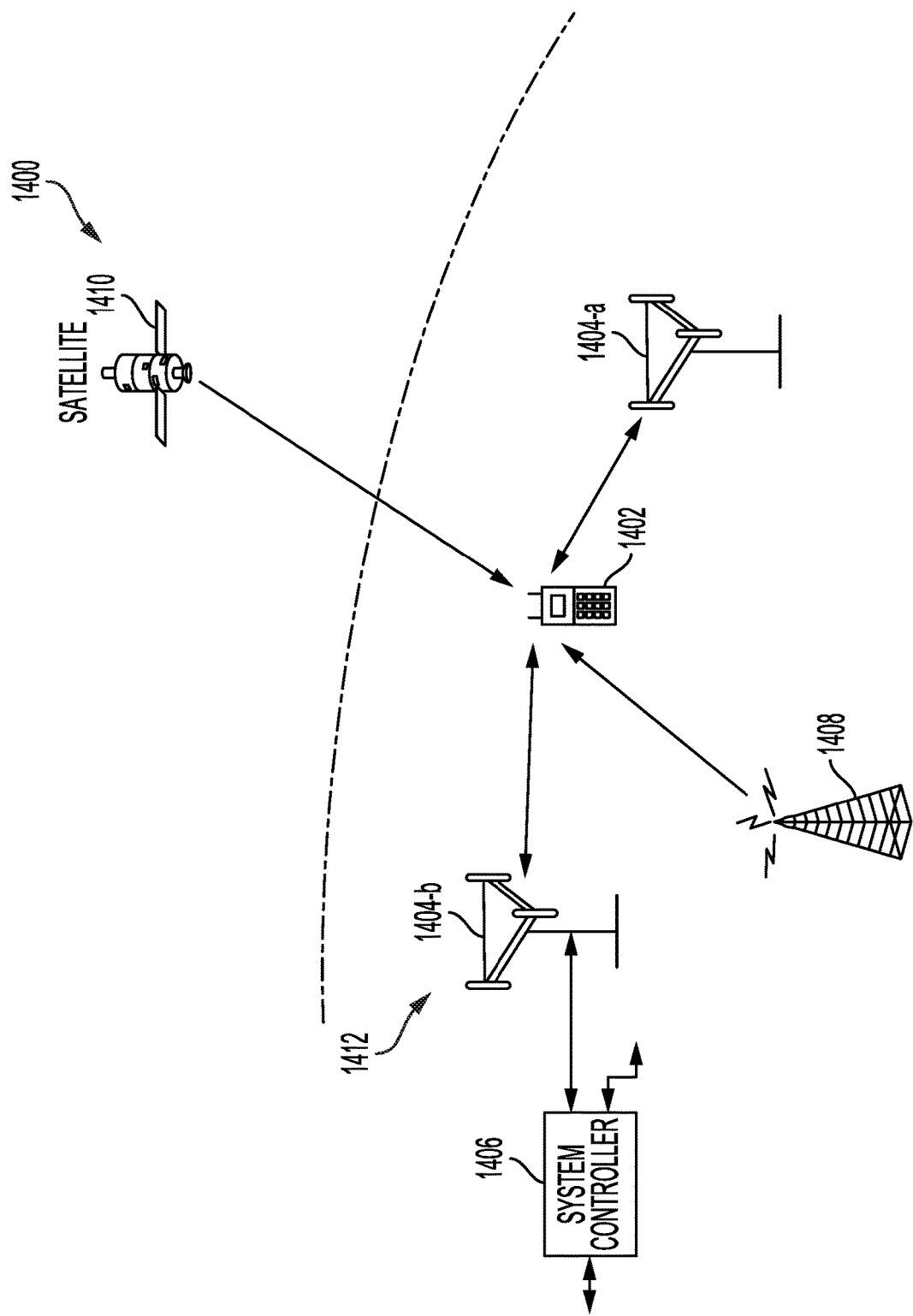
FIG. 14 is a diagram of an example of a wireless communication network that may include the wireless device of FIG. 13.

FIG. 14 is a diagram of an example of a wireless communication network 1400 that may include the wireless device 1302 of FIG. 13. FIG. 14 shows a wireless device 1402 communicating with a wireless communication system 1412. The wireless communication system 1412 may be a 5G system, a long-term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, shows the wireless communication system 1412 including two access points/base stations 1404a and 1404b and one system controller 1406. In general, a wireless system may include any number of access points/base stations and any number of network entities.

A wireless device 1402 may be referred to as a user equipment (UE), a mobile station, a terminal, an access terminal, a subscriber unit, a station, etc. The wireless device 1402 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc.

The wireless device 1402 may be capable of communicating with the wireless communication system 1412. The wireless device 1402 may also be capable of receiving signals from broadcast stations (e.g., a broadcast station 1408), signals from satellites (e.g., a satellite 1410) in one or more global navigation satellite systems (GNSS), etc. The wireless device 1402 may support one or more radio technologies for wireless communication such as 5G, LTE, CDMA2000, WCDMA, TD-SCDMA, GSM, 802.11, mmWave, etc.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general-purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The bus may also link various other circuits such as timing sources, peripherals, voltage regulators, power management circuits, and the like.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An amplifier circuit comprising:
   one or more amplifier stages, each of the one or more amplifier stages including a complementary transistor configuration, comprising:
   an NMOS transistor having a gate terminal electrically coupled to an input node configured to receive an input signal, a source terminal electrically coupled to ground, and a drain terminal electrically coupled to a first supply voltage through a first inductive impedance element; and
   a PMOS transistor having a gate terminal electrically coupled to the input node, a source terminal electrically coupled to a second supply voltage, and a drain terminal electrically coupled to ground through a second inductive impedance element, the NMOS transistor electrically coupled in parallel to the PMOS transistor; and
   an output amplifier stage electrically coupled to an output of the one or more amplifier stages, the output amplifier stage including a non-complementary transistor configuration comprising one or more NMOS transistors or PMOS transistors.

2. The amplifier circuit of claim 1, wherein the first inductive impedance element and the second inductive impedance elements are inductively coupled.

3. The amplifier circuit of claim 1, wherein outputs of the NMOS transistor and the PMOS transistor are electrically coupled to provide a common output signal through one or more reactive elements.

4. The amplifier circuit of claim 3, wherein the one or more reactive elements comprises a first reactive element electrically coupled between the drain terminal of the NMOS transistor and an output node and a second reactive element electrically coupled between the drain terminal of the PMOS transistor and the output node.

5. The amplifier circuit of claim 3, wherein the one or more reactive elements comprises one or more transformers.

6. The amplifier circuit of claim 1, further comprising a first DC blocking capacitor electrically coupled between the input node and the gate terminal of the NMOS transistor and a second DC blocking capacitor electrically coupled between the input node and the gate terminal of the PMOS transistor.

7. The amplifier circuit of claim 1, wherein the NMOS transistor is a first NMOS transistor, and wherein the PMOS transistor is a first PMOS transistor, wherein the input node is a first input node configured to receive a first input signal of a differential signal and wherein each of the one or more amplifier stages further comprises:
   a second NMOS transistor having a gate terminal electrically coupled to a second input node configured to receive a second input signal of the differential signal, a source terminal electrically coupled to ground, and a drain terminal electrically coupled to the first supply voltage through a third inductive impedance element; and a second PMOS transistor having a gate terminal electrically coupled to the second input node configured to receive the second input signal of the differential signal, a source terminal electrically coupled to the second supply voltage, and a drain terminal electrically coupled to ground through a fourth inductive impedance element.

8. The amplifier circuit of claim 7, wherein the first, second, third, and fourth inductive impedance elements form a portion of one or more transformers.

9. The amplifier circuit of claim 7, further comprising an inter-stage matching circuit coupled between stages of the one or more amplifier stages or between the one or more amplifier stages and the output amplifier stage, the inter-stage matching circuit comprising:

a transformer having a primary side electrically coupled in series on one side to the first inductive impedance element and to the third impedance inductive element on the other side;

a fifth inductive impedance element electrically coupled to one side of a secondary side of the transformer and configured to provide a first output; and a sixth inductive impedance element electrically coupled to the other side of the secondary side the transformer and configured to provide a second output.

10. The amplifier circuit of claim 9, wherein the transformer is a tightly coupled transformer.

11. The amplifier circuit of claim 7, further comprising an inter-stage matching circuit coupled between stages of the one or more amplifier stages or between the one or more amplifier stages and the output amplifier stage, the inter-stage matching circuit comprising:

a transformer having a primary side electrically coupled in series on one side to the drain terminal of the first PMOS transistor and electrically coupled on the other side of the primary side to the drain terminal of the second PMOS transistor, a secondary side of the transformer electrically coupled to at least one of the output amplifier stage or another stage of the one or more amplifier stages.

12. The amplifier circuit of claim 7, further comprising a matching circuit electrically coupled between stages of the one or more amplifier stages or between a stage of the one or more amplifier stages and the output amplifier stage, the matching circuit comprising a transformer and a capacitor electrically coupled between a ground node and a center tap of at least one of the primary or secondary sides of the transformer, the capacitor electrically coupled in series with one or more elements of the matching circuit to form a common mode short at substantially a second harmonic of an amplifier operating frequency of the amplifier circuit.

13. The amplifier circuit of claim 7, wherein the output amplifier stage comprises:

a third NMOS transistor having a gate terminal electrically coupled to outputs of the first NMOS transistor and the first PMOS transistor of one of the one or more amplifier stages, a drain terminal electrically coupled to an output transformer, and a source terminal electrically coupled to ground; and a fourth NMOS transistor having a gate terminal electrically coupled to outputs of the second NMOS transistor and the second PMOS transistor of the one of the one or more amplifier stages, a drain terminal electrically coupled to the output transformer, and a source terminal electrically coupled to ground.

14. The amplifier circuit of claim 1, wherein outputs of the NMOS transistor and the PMOS transistor are coupled to provide a common output signal in at least one of the one or more amplifier stages through one or more reactive components, wherein the output amplifier stage comprises:

a second NMOS transistor having a gate terminal coupled to receive the common output signal, a drain terminal electrically coupled to an amplifier output node, and a source terminal electrically coupled to ground.

15. The amplifier circuit of claim 1, wherein an operating frequency of the amplifier circuit is within a mmWave range.

16. The amplifier circuit of claim 15, wherein the amplifier circuit is one of a plurality of amplifier circuits in a phased array transceiver.

17. An amplifier circuit comprising:

a first amplifier stage comprising a first path electrically coupled to one or more input nodes and a second path electrically coupled to the one or more input nodes, the first amplifier stage comprising one or more first PMOS transistors in the first path and one or more first NMOS transistors in the second path;

a second amplifier stage comprising a first path electrically coupled to the first path of the first amplifier stage and comprising one or more second NMOS transistors in the first path, the second amplifier stage comprising a second path electrically coupled to the second path of the first amplifier stage and comprising one or more second PMOS transistors in the second path; and an output amplifier stage electrically coupled to the second amplifier stage and further electrically coupled to both the first path and the second path to form a common path for the output amplifier stage, the output amplifier stage comprising a non-complementary transistor configuration.

18. The amplifier circuit of claim 17, wherein the output amplifier stage comprises one or more NMOS transistors.

19. The amplifier circuit of claim 17, wherein the one or more first PMOS transistors in the first path of the first amplifier stage comprises:

a first PMOS transistor having a gate terminal coupled to a first input node of the one or more input nodes, a source terminal coupled to a supply voltage, and a drain terminal electrically coupled to ground through a first inductive impedance element;

a second PMOS transistor having a gate terminal coupled to a second input node of the one or more input nodes, a source terminal coupled to the supply voltage, and a drain terminal electrically coupled to ground through a second inductive impedance element.

20. The amplifier circuit of claim 17, wherein the one or more first NMOS transistors in the second path of the first amplifier stage comprises:

a first NMOS transistor having a gate terminal coupled to a first input node of the one or more input nodes, a drain terminal coupled to a supply voltage through a first inductive impedance element, and a source terminal electrically coupled to ground; and a second NMOS transistor having a gate terminal coupled to a second input node of the one or more input nodes, a drain terminal coupled to the supply voltage through a second inductive impedance element, and a source terminal electrically coupled to ground.

21. The amplifier circuit of claim 17, wherein the one or more first PMOS transistors in the first path of the first amplifier stage comprises a first PMOS transistor having a gate terminal coupled to an input node of the one or more input nodes, a source terminal coupled to a first supply voltage, and a drain terminal electrically coupled to ground through a first inductive impedance element, wherein the one or more first NMOS transistors in the second path of the first amplifier stage comprises a first NMOS transistor having a gate terminal coupled to the input node, a drain terminal coupled to a second supply voltage through a second inductive impedance element, and a source terminal electrically coupled to ground, wherein the one or more second PMOS transistors in the second path of the second amplifier stage comprises a second PMOS transistor having a gate terminal coupled to a first output of the one or more first NMOS transistors in the second path of the first amplifier stage, a source terminal coupled to a third supply voltage, and a drain terminal electrically coupled to ground through a third inductive impedance element, and wherein the one or more second NMOS transistors in the first path of the second amplifier stage comprises a second NMOS transistor having a gate terminal coupled to a second output of the one or more first PMOS transistors in the first path of the first amplifier stage, a drain terminal coupled to a fourth supply voltage through a fourth inductive impedance element, and a source terminal electrically coupled to ground.

22. The amplifier circuit of claim 17, further comprising an inter-stage matching circuit coupled between the first amplifier stage and the second amplifier stage, the inter-stage matching circuit comprising:
a first inductive impedance element electrically coupled to a first output node in the first path of the first amplifier stage;
a second inductive impedance element electrically coupled to a second output node in the first path of the first amplifier stage;
a transformer having a primary side electrically coupled in series on one side to the first inductive impedance element and to the second inductive impedance element on the other side;
a third inductive impedance element electrically coupled to one side of a secondary side of the transformer and electrically coupled to a first input node in the first path of the second amplifier stage; and
a fourth impedance inductive element electrically coupled to the other side of the secondary side of the transformer and electrically coupled to a second input node in the first path of the second amplifier stage.

23. The amplifier circuit of claim 17, wherein the output amplifier stage comprises:
a first NMOS transistor having a gate terminal electrically coupled to the first and second paths of the second amplifier stage, a drain terminal electrically coupled to an output transformer, and a source terminal electrically coupled to ground; and
a second NMOS transistor having a gate terminal coupled to the first and second paths of the second amplifier stage, a drain terminal electrically coupled to the output transformer, and a source terminal electrically coupled to ground.

24. The amplifier circuit of claim 17, wherein the one or more input nodes comprise a first input node and a second input node together configured to receive a differential signal.

25. The amplifier circuit of claim 17, wherein the output amplifier stage comprises:

an NMOS transistor having a gate terminal coupled to the first and second paths of the second amplifier stage, a drain terminal electrically coupled to an amplifier output, and a source terminal electrically coupled to ground.

26. An amplifier circuit comprising:
one or more amplifier stages, each of the one or more amplifier stages including a complementary transistor configuration, comprising:
a first NMOS transistor having a gate terminal electrically coupled to a first input node configured to receive a first input signal of a differential signal, a source terminal electrically coupled to ground, and a drain terminal electrically coupled to a first supply voltage through a first inductive impedance element;
a first PMOS transistor having a gate terminal electrically coupled to the first input node, a source terminal electrically coupled to a second supply voltage, and a drain terminal electrically coupled to ground through a second inductive impedance element, the first NMOS transistor electrically coupled in parallel to the first PMOS transistor;
a second NMOS transistor having a gate terminal electrically coupled to a second input node configured to receive a second input signal of the differential signal, a source terminal electrically coupled to ground, and a drain terminal electrically coupled to the first supply voltage through a third inductive impedance element; and
a second PMOS transistor having a gate terminal electrically coupled to the second input node, a source terminal electrically coupled to the second supply voltage, and a drain terminal electrically coupled to ground through a fourth inductive impedance element; and
an output amplifier stage electrically coupled to an output of the one or more amplifier stages, the output amplifier stage including a non-complementary transistor configuration, the output amplifier stage comprising:
a third NMOS transistor having a gate terminal electrically coupled to outputs of the first NMOS transistor and the first PMOS transistor of one of the one or more amplifier stages, a drain terminal electrically coupled to an output transformer, and a source terminal electrically coupled to ground; and
a fourth NMOS transistor having a gate terminal electrically coupled to outputs of the second NMOS transistor and the second PMOS transistor of the one of the one or more amplifier stages, a drain terminal electrically coupled to the output transformer, and a source terminal electrically coupled to ground.

27. The amplifier circuit of claim 26, wherein the first inductive impedance element and the second inductive impedance elements are inductively coupled.

28. The amplifier circuit of claim 26, further comprising a matching circuit electrically coupled between stages of the one or more amplifier stages or between a stage of the one or more amplifier stages and the output amplifier stage, the matching circuit comprising a transformer and a capacitor electrically coupled between a ground node and a center tap of at least one of the primary or secondary sides of the transformer, the capacitor electrically coupled in series with one or more elements of the matching circuit to form a common mode short at substantially a second harmonic of an amplifier operating frequency of the amplifier circuit.

* * * * *